United States Patent
Mizukami

(10) Patent No.: US 9,987,843 B2
(45) Date of Patent: Jun. 5, 2018

(54) LIQUID DISCHARGE HEAD, LIQUID DISCHARGE DEVICE, AND LIQUID DISCHARGE APPARATUS

(71) Applicant: Satoshi Mizukami, Kanagawa (JP)

(72) Inventor: Satoshi Mizukami, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days. days.

(21) Appl. No.: 15/592,447

(22) Filed: May 11, 2017

(65) Prior Publication Data
US 2017/0334205 A1    Nov. 23, 2017

(30) Foreign Application Priority Data

May 19, 2016  (JP) .................................. 2016-100138
Sep. 23, 2016  (JP) .................................. 2016-186264

(51) Int. Cl.
*B41J 2/14*        (2006.01)
*C04B 35/493*   (2006.01)
(Continued)

(52) U.S. Cl.
CPC ........... *B41J 2/14233* (2013.01); *B41J 2/045* (2013.01); *C04B 35/493* (2013.01); *H01L 41/09* (2013.01);
(Continued)

(58) Field of Classification Search
CPC .... B41J 2/14233; B41J 2/045; B41J 2202/03; H01L 41/316; H01L 41/187;
(Continued)

(56) References Cited

U.S. PATENT DOCUMENTS

| 2011/0090289 A1 | 4/2011 | Mizukami |
| 2012/0206545 A1 | 8/2012 | Kato et al. |

(Continued)

FOREIGN PATENT DOCUMENTS

| JP | 2005-175099 | 6/2005 |
| JP | 2007-096248 | 4/2007 |

(Continued)

OTHER PUBLICATIONS

U.S. Appl. No. 15/370,025, filed Dec. 6, 2016.
U.S. Appl. No. 15/389,731, filed Dec. 23, 2016.

*Primary Examiner* — Henok Legesse
(74) *Attorney, Agent, or Firm* — Cooper & Dunham LLP

(57) ABSTRACT

A liquid discharge head includes a nozzle plate, a substrate, a diaphragm, and a piezoelectric element. The nozzle plate includes a nozzle from which liquid is discharged. The substrate is disposed on the nozzle plate and includes a pressure chamber communicating with the nozzle. The diaphragm is disposed on a first side of the substrate opposite a second side of the substrate on which the nozzle plate is disposed, the diaphragm constituting one wall of the pressure chamber. The piezoelectric element is disposed on the diaphragm to deform the diaphragm to discharge liquid in the pressure chamber from the nozzle. The piezoelectric element includes a first electrode, a piezoelectric film, and a second electrode. The first electrode is disposed on the diaphragm. The piezoelectric film is disposed on the first electrode.

13 Claims, 17 Drawing Sheets

(51) Int. Cl.
*H01L 41/187* (2006.01)
*H01L 41/09* (2006.01)
*B41J 2/045* (2006.01)
*H01L 41/316* (2013.01)
*C23C 14/08* (2006.01)
*H01L 41/08* (2006.01)

(52) U.S. Cl.
CPC .......... *H01L 41/187* (2013.01); *H01L 41/316* (2013.01); *B41J 2202/03* (2013.01); *C23C 14/08* (2013.01); *H01L 41/0805* (2013.01)

(58) Field of Classification Search
CPC ... H01L 41/0805; H01L 41/09; C04B 35/493; C23C 14/08
See application file for complete search history.

(56) References Cited

U.S. PATENT DOCUMENTS

| | | | |
|---|---|---|---|
| 2012/0212545 A1 | 8/2012 | Mizukami et al. | |
| 2012/0229573 A1 | 9/2012 | Mizukami et al. | |
| 2012/0236083 A1 | 9/2012 | Mizukami et al. | |
| 2013/0002767 A1 | 1/2013 | Mizukami et al. | |
| 2013/0070029 A1 | 3/2013 | Mizukami et al. | |
| 2013/0162726 A1 | 6/2013 | Mizukami et al. | |
| 2013/0250007 A1 | 9/2013 | Ishimori et al. | |
| 2013/0250009 A1 | 9/2013 | Ishimori et al. | |
| 2014/0368583 A1* | 12/2014 | Morozumi | H01L 41/1876 347/68 |
| 2015/0022592 A1* | 1/2015 | Aoyama | B41J 2/14233 347/68 |
| 2015/0077475 A1 | 3/2015 | Mizukami et al. | |
| 2015/0263263 A1* | 9/2015 | Akiyama | B41J 2/161 347/68 |
| 2015/0266296 A1 | 9/2015 | Mizukami et al. | |
| 2015/0349240 A1 | 12/2015 | Mizukami | |
| 2016/0099402 A1 | 4/2016 | Mizukami et al. | |
| 2016/0167383 A1 | 6/2016 | Mizukami | |
| 2016/0236470 A1 | 8/2016 | Mizukami | |
| 2016/0263892 A1 | 9/2016 | Mizukami | |
| 2016/0263893 A1 | 9/2016 | Mizukami et al. | |
| 2016/0351788 A1* | 12/2016 | Mizukami | H01L 41/187 |

FOREIGN PATENT DOCUMENTS

| | | |
|---|---|---|
| JP | 2007-288123 | 11/2007 |
| JP | 2008-042191 | 2/2008 |
| JP | 2008-218675 | 9/2008 |
| JP | 2016-225409 | 12/2016 |

* cited by examiner

LIQUID DISCHARGE HEAD, LIQUID DISCHARGE DEVICE, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2016-100138, filed on May 19, 2016, and Japanese Patent Application No. 2016-186264, filed on September 23, 2016, in the Japan Patent Office, the entire disclosures of which are hereby incorporated by reference herein.

BACKGROUND

Technical Field

Aspects of the present disclosure relate to a liquid discharge head, a liquid discharge device, and a liquid discharge apparatus incorporating the liquid discharge head.

Related Art

As a liquid discharge device for discharging liquid inside a pressure chamber from nozzles, a liquid discharge head utilizing an electromechanical transducer element is known. The electromechanical transducer element includes a first electrode, an electromechanical transducer film, and a second electrode. The first electrode, the electromechanical transducer film, and the second electrode are disposed on a diaphragm that forms a part of a wall of the pressure chamber.

SUMMARY

In an aspect of this disclosure, there is provided a novel liquid discharge head that includes a nozzle plate, a substrate, a diaphragm, and a piezoelectric element. The nozzle plate includes a nozzle from which liquid is discharged. The substrate is disposed on the nozzle plate and includes a pressure chamber communicating with the nozzle. The diaphragm is disposed on a first side of the substrate opposite a second side of the substrate on which the nozzle plate is disposed, the diaphragm constituting one wall of the pressure chamber. The piezoelectric element is disposed on the diaphragm to deform the diaphragm to discharge liquid in the pressure chamber from the nozzle.

The piezoelectric element includes a first electrode, a piezoelectric film, and a second electrode. The first electrode is disposed on the diaphragm. The piezoelectric film is disposed on the first electrode. The second electrode is disposed on the piezoelectric film. The piezoelectric film is a $\{100\}$ preferentially oriented polycrystalline film in which $\{100\}$ plane is preferentially oriented. The pressure chamber has a first length Lx in X-direction and a second length Ly in Y-direction perpendicular to the X-direction. The second length Ly is longer than the first length Lx.

A first domain ratio $S1x=Sc/(Sa+Sc)$ is different from a second domain ratio of $S1y=Sc/(Sa+Sc)$ where the first domain ratio $S1x=Sc/(Sa+Sc)$ is measured such that an incident surface of X-ray in the θ-2θ measurement is parallel to the X-direction, and the second domain ratio $S1y=Sc/(Sa+Sc)$ is measured such that an incident surface of X-ray in the θ-2θ measurement is parallel to the Y-direction. Two diffraction peak areas Sa and Sc are attributed to a tetragonal a-domain structure and a tetragonal c-domain structure, respectively, among a plurality of diffraction peak areas obtained by a peak separation process of diffraction peaks derived from $\{200\}$ plane or $\{400\}$ plane obtained by the θ-2θ measurement of the piezoelectric film according to the X-ray diffraction method.

In another aspect of this disclosure, there is provided a novel liquid discharge head that includes a nozzle plate, a substrate, a diaphragm, and a piezoelectric element. The nozzle plate includes a nozzle from which liquid is discharged. The substrate is disposed on the nozzle plate. The substrate includes a pressure chamber communicating with the nozzle. The diaphragm is disposed on a first side of the substrate opposite a second side of the substrate on which the nozzle plate is disposed, the diaphragm constituting one wall of the pressure chamber. The piezoelectric element is disposed on the diaphragm to deform the diaphragm to discharge liquid in the pressure chamber from the nozzle.

The piezoelectric element includes a first electrode, a piezoelectric film, and a second electrode. The first electrode is disposed on the diaphragm. The piezoelectric film is disposed on the first electrode. The second electrode is disposed on the piezoelectric film. The piezoelectric film is a $\{100\}$ preferentially oriented polycrystalline film in which $\{100\}$ plane is preferentially oriented. The pressure chamber having first length Lx in X-direction and second length Ly in Y-direction perpendicular to the X-direction. The second length Ly is longer than the first length Lx.

A first domain ratio $S2x=Sc/(Sa+Sc+Sb)$ is different from a second domain ratio $S2y=Sc/(Sa+Sc+Sb)$, where the first domain ratio $S2x=Sc/(Sa+Sc+Sb)$ is measured such that an incident surface of X-ray in the θ-2θ measurement is parallel to the X-direction, and the second domain ratio $S2y=Sc/(Sa+Sc+Sb)$ is measured such that an incident surface of X-ray in the θ-2θ measurement is parallel to the Y-direction. Two of diffraction-peak areas Sa and Sc are attributed to a tetragonal a-domain structure and a tetragonal c-domain structure, respectively, among a plurality of diffraction peak areas obtained by a peak separation process of diffraction peaks derived from $\{200\}$ plane or $\{400\}$ plane obtained by the θ-2θ measurement of the piezoelectric film according to the X-ray diffraction method, and a diffraction-peak area Sb attributes to any one of a rhombohedral structure, an orthorhombic structure, and a pseudo-cubic structure.

In still another aspect of this disclosure, there is provided a novel liquid discharge device including a liquid discharge head and a head-tank. The liquid discharge head discharges liquid. The head-tank supplies liquid to the liquid discharge head. The liquid discharge head includes a nozzle plate, a substrate, a diaphragm, and a piezoelectric element. The nozzle plate includes a nozzle from which liquid is discharged. The substrate is disposed on the nozzle plate. The substrate includes a pressure chamber communicating with the nozzle. The diaphragm is disposed on a first side of the substrate opposite a second side of the substrate on which the nozzle plate is disposed, the diaphragm constituting one wall of the pressure chamber. The piezoelectric element is disposed on the diaphragm to deform the diaphragm to discharge liquid in the pressure chamber from the nozzle.

The piezoelectric element includes a first electrode, a piezoelectric film, and a second electrode. The first electrode is disposed on the diaphragm. The piezoelectric film is disposed on the first electrode. The second electrode is disposed on the piezoelectric film. The piezoelectric film is a $\{100\}$ preferentially oriented polycrystalline film in which $\{100\}$ plane is preferentially oriented. The pressure chamber has a first length Lx in X-direction and a second length Ly in Y-direction perpendicular to the X-direction. The second length Ly being longer than the first length Lx.

A first domain ratio S1x=Sc/(Sa+Sc) is different from a second domain ratio of S1y=Sc/(Sa+Sc) where the first domain ratio S1x=Sc/(Sa+Sc) is measured such that an incident surface of X-ray in the θ-2θ measurement is parallel to the X-direction, and the second domain ratio S1y=Sc/(Sa+Sc) is measured such that an incident surface of X-ray in the θ-2θ measurement is parallel to the Y-direction. Two diffraction peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film according to the X-ray diffraction method.

In still yet another aspect of this disclosure, there is provided a novel liquid discharge apparatus including a liquid discharge head and a conveyor. The liquid discharge head discharge liquid. The conveyor conveys medium to the liquid discharge head to discharge liquid on the medium. The liquid discharge head includes a nozzle plate, a substrate, a diaphragm, and a piezoelectric element. The nozzle plate includes a nozzle from which liquid is discharged. The substrate is disposed on the nozzle plate and including a pressure chamber communicating with the nozzle. The diaphragm is disposed on a first side of the substrate opposite a second side of the substrate on which the nozzle plate is disposed, the diaphragm constituting one wall of the pressure chamber. The piezoelectric element is disposed on the diaphragm to deform the diaphragm to discharge liquid in the pressure chamber from the nozzle. The piezoelectric element includes a first electrode, a piezoelectric film, and a second electrode. The first electrode is disposed on the diaphragm. The piezoelectric film is disposed on the first electrode. The second electrode is disposed on the piezoelectric film. The piezoelectric film is a {100} preferentially oriented polycrystalline film in which {100} plane is preferentially oriented. The pressure chamber has a first length Lx in X-direction and a second length Ly in Y-direction perpendicular to the X-direction. The second length Ly being longer than the first length Lx.

A first domain ratio S1x=Sc/(Sa+Sc) is different from a second domain ratio of S1y=Sc/(Sa+Sc) where the first domain ratio S1x=Sc/(Sa+Sc) is measured such that an incident surface of X-ray in the θ-2θ measurement is parallel to the X-direction, and the second domain ratio S1y=Sc/(Sa+Sc) is measured such that an incident surface of X-ray in the θ-2θ measurement is parallel to the Y-direction. Two diffraction peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film according to the X-ray diffraction method.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
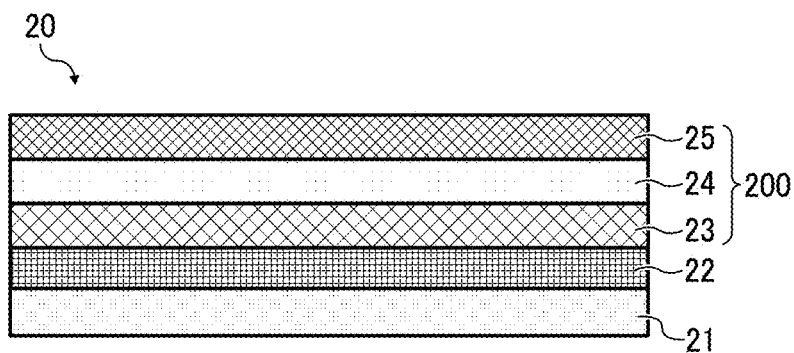
FIG. 1 is a cross-sectional view of an example of the configuration of a piezoelectric element according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable. As used herein, the singular forms "a", "an", and "the" are intended to include the plural forms as well, unless the context clearly indicates otherwise.

Referring now to the drawings, wherein like reference numerals designate identical or corresponding parts throughout the several views, embodiments of the present disclosure are described below.

Hereinafter, embodiments of the present disclosure are described with reference to the attached drawings. Referring now to the drawings, wherein like reference numerals designate identical or corresponding parts throughout the several views, embodiments of the present disclosure are described below.

Below, a description is given of an electromechanical transducer element according to embodiments of the present disclosure, forming a part of a liquid discharge head used in an inkjet recording apparatus as an example of a liquid discharge apparatus. Note that the claimed disclosure is not limited to the following embodiments.

Inkjet recording apparatuses have many advantages, such as extremely quiet operation, high-speed printing, a high degree of flexibility in choice of ink, i.e., liquid for image formation, and availability of low-cost plain paper. Accordingly, inkjet recording apparatuses are widely used as image forming apparatuses, such as printers, facsimile machines, and copiers.

A liquid discharge head used in such an inkjet recording apparatus includes, for example, nozzles to discharge droplets of liquid (ink) for image formation, pressure chambers communicated with the nozzles, and pressure generators to generate pressure to discharge ink from the pressure chambers. A pressure generator according to this embodiment is a piezo-type pressure generator including a diaphragm and an electromechanical transducer element (hereinafter, referred to as a "piezoelectric element"). The diaphragm forms one of the walls of the pressure chamber, and the piezoelectric element includes a thin electromechanical transducer film (hereinafter, referred to as a "piezoelectric film") made of a piezoelectric material to deform the diaphragm. When a predetermined voltage is applied to the piezoelectric element, the piezoelectric element deforms to displace a surface of the diaphragm toward the pressure chamber, thus generating pressure in liquid in the pressure chamber. The pressure allows liquid droplets (ink droplets) to be discharged from a nozzle communicated with the pressure chamber.

The piezoelectric material forming the piezoelectric film is made of a material having piezoelectric properties, that is, is capable of being deformed by application of a voltage. In this embodiment, as the piezoelectric material, lead zirconate titanate (PZT: $Pb(Zr_x, Ti_{1-x})O_3$) is used that is a ternary metal oxide having a crystal structure of perovskite. There is a plurality of types of vibration modes for applying a drive voltage on the piezoelectric element including the piezoelectric film made of PZT. Examples of the vibration modes include a vertical vibration mode (push mode) involving deformation in a film thickness direction with piezoelectric constant d33, a lateral vibration mode (bend mode) involving bending deformation with piezoelectric constant d31, and a shear mode utilizing shearing deformation of film.

For the piezoelectric element including the piezoelectric film, as described below, pressure chambers and piezoelectric elements can be directly built into a Si substrate by using semiconductor processing and micro electro mechanical systems (MEMS). Accordingly, the piezoelectric elements can be formed as thin-film piezoelectric actuators to generate pressure in the pressure chambers.

Figure 2:
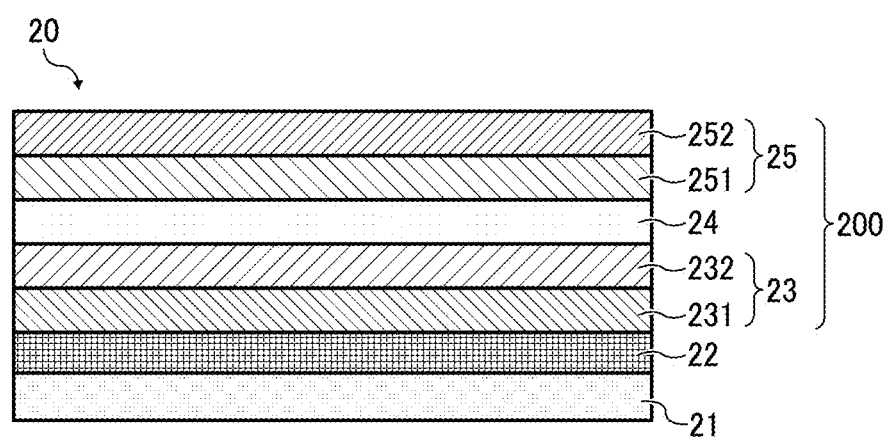
FIG. 2 is a cross-sectional view of another example of the configuration of a piezoelectric element according to an embodiment of the present disclosure.

FIGS. 1 and 2 are cross-sectional views of schematic configurations of piezoelectric actuators including piezoelectric elements according to embodiments of the present disclosure.

In a configuration example of FIG. 1, a piezoelectric actuator 20 includes a substrate 21, a diaphragm 22, and a piezoelectric element 200 that are laminated in this order from the bottom thereof. The piezoelectric element 200 includes a lower electrode 23 as a first electrode, a piezoelectric film 24, and an upper electrode 25 as a second electrode. The lower electrode (first electrode) 23 is formed (disposed) on the substrate 21 with the diaphragm 22 interposed in between the lower electrode 23 and the substrate 21. The piezoelectric film 24 is foamed (disposed) on the lower electrode 23. The upper electrode (second electrode) 25 is formed (disposed) on the piezoelectric film 24.

The lower electrode 23 includes an electrode layer made of, e.g., a metal layer disposed directly under a lower face as a first surface of the piezoelectric film 24 or below the lower face of the piezoelectric film 24 with an intervening layer, such as a base layer, in between. The upper electrode 25 includes an electrode layer made of, e.g., a metal layer disposed directly on an upper face as a second surface of the piezoelectric film 24 or on the upper face of the piezoelectric film 24 with an intervening layer, such as a base layer, in between. Applying a voltage between the lower electrode 23 and the upper electrode 25 allows formation of an electric field in a film thickness direction of the piezoelectric film 24. Here, each of the lower electrode 23 and the upper electrode 25 may be, e.g., a combination of a metal layer having a sufficiently small electrical resistance and an oxide electrode layer having conductivity. For example, in a configuration example of FIG. 2, the lower electrode 23 includes a metal layer 231 and an oxide electrode layer 232 laminated on the metal layer 231. The metal layer 231 is disposed at a side closer to the diaphragm 22 and the oxide electrode layer 232 is disposed at a side closer to the piezoelectric film 24. The upper electrode 25 includes an oxide electrode layer 251 and a metal layer 252 laminated on the oxide electrode layer 251. The oxide electrode layer 251 is disposed at a side closer to the piezoelectric film 24. The oxide electrode layer 232 and the oxide electrode layer 251 are advantageous in suppressing a reduction in the amount of deformation (the amount of surface displacement) of the piezoelectric element 200 in continuous driving as the piezoelectric actuator. Each of the oxide electrode layer 232 and the oxide electrode layer 251 may be a seed layer made of, for example, lead titanate (PT). Such a configuration more reliably suppresses a reduction in the amount of deformation (the amount of displacement of a surface) of the piezoelectric element 200.

Figure 3A:
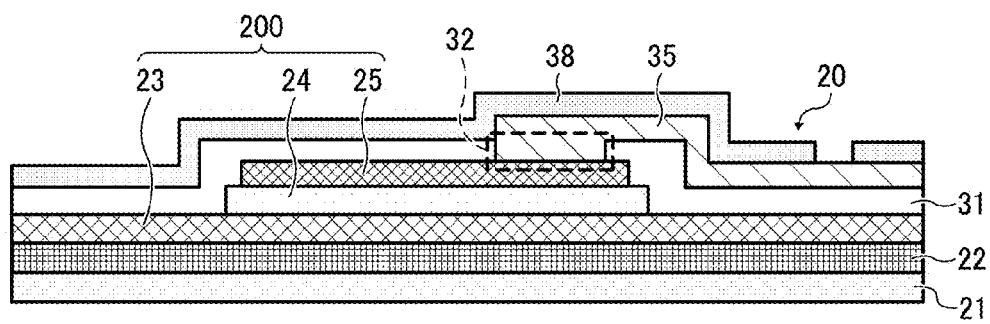
FIG. 3A is a cross-sectional view of a schematic configuration example of a piezoelectric element disposed in a liquid discharge head according to an embodiment of the present disclosure.
Figure 3B:
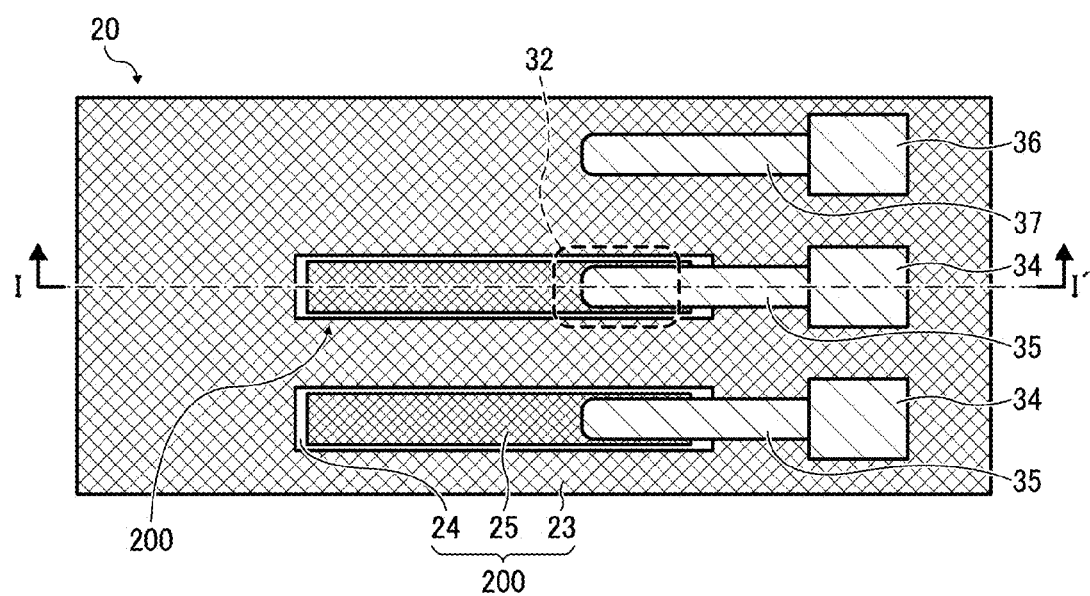
FIG. 3B is a plan view of the piezoelectric element of FIG. 3A.

FIGS. 3A and 3B are illustrations of an example of a configuration in which the piezoelectric actuator 20 including the piezoelectric element 200 according to an embodiment of the present disclosure is used in, for example, a liquid discharge head 104. FIG. 3A is a cross-sectional view of a schematic configuration example of the piezoelectric element 200 in the liquid discharge head 104 according to an embodiment of the present disclosure. FIG. 3B is a plan view of the piezoelectric element 200 of FIG. 3A. Note that, in FIG. 3B, a first insulating protective film (inter-layer insulating film) 31 and a second insulating protective film (inter-layer insulating film) 38 are omitted for ease of understanding of the configuration of the piezoelectric element 200. FIG. 3A is a cross-sectional view of the piezoelectric element 200 cut along line I-I' of FIG. 3B.

As illustrated in FIG. 3A, the piezoelectric actuator 20 includes the piezoelectric element 200. The piezoelectric element 200 includes the lower electrode (first electrode) 23, the piezoelectric film 24, and the upper electrode (second electrode) 25. As illustrated in FIG. 3B, a plurality of piezoelectric elements 200 having such a configuration is arrayed in a predetermined direction along a surface of the substrate 21. The plurality of piezoelectric elements 200 is disposed above the substrate 21 with the diaphragm 22 interposed in between.

Any one of the lower electrode 23 and the upper electrode 25 may be configured as a common electrode shared by the plurality of piezoelectric elements 200. In such a configuration, the other of the lower electrode 23 and the upper electrode 25 is configured as discrete electrodes that are separately disposed corresponding to the respective piezoelectric elements 200 and independent of each other. Note that, in the configuration example of FIGS. 3A and 3B, the lower electrode 23 is a common electrode and the upper electrode 25 is configured as discrete electrodes that are separately disposed corresponding to the respective piezoelectric elements 200 and independent of each other.

A first insulating protective film 31 as an inter-layer insulating film is disposed on a predetermined area on the upper electrode 25 and the lower electrode 23. As described below, the first insulating protective film 31 may be made of an inorganic compound. At a predetermined position of the first insulating protective film 31, a contact-hole 32 is disposed to electrically connect the upper electrode 25 and the lower electrode 23 to other electrodes.

In FIGS. 3A and 3B, each upper electrode 25 as the discrete electrode is connected to a discrete electrode pad 34 to connect an external circuit. The upper electrode 25, which is a discrete electrode, and the discrete electrode pad 34 are electrically connected with, for example, a connector 35.

In FIGS. 3A and 3B, each lower electrode 23 as the common electrode is connected to a common electrode pad 36 to connect an external circuit. The lower electrode 23 as the common electrode and the common electrode pad 36 are electrically connected with, for example, an inter-pad connector 37.

A second insulating protective film 38 is disposed on the common electrode pad 36 and the discrete electrode pad 34. As described below, the second insulating protective film 38 may be made of an inorganic compound. The second insulating protective film 38 includes an opening portion through which each of the common electrode pad 36 and the discrete electrode pad 34 is partially exposed to the outside.

Next, a description is given of a method of performing polarization processing on a piezoelectric film 24 in a production process of the piezoelectric element 200 having the above-described configuration.

Figure 4:
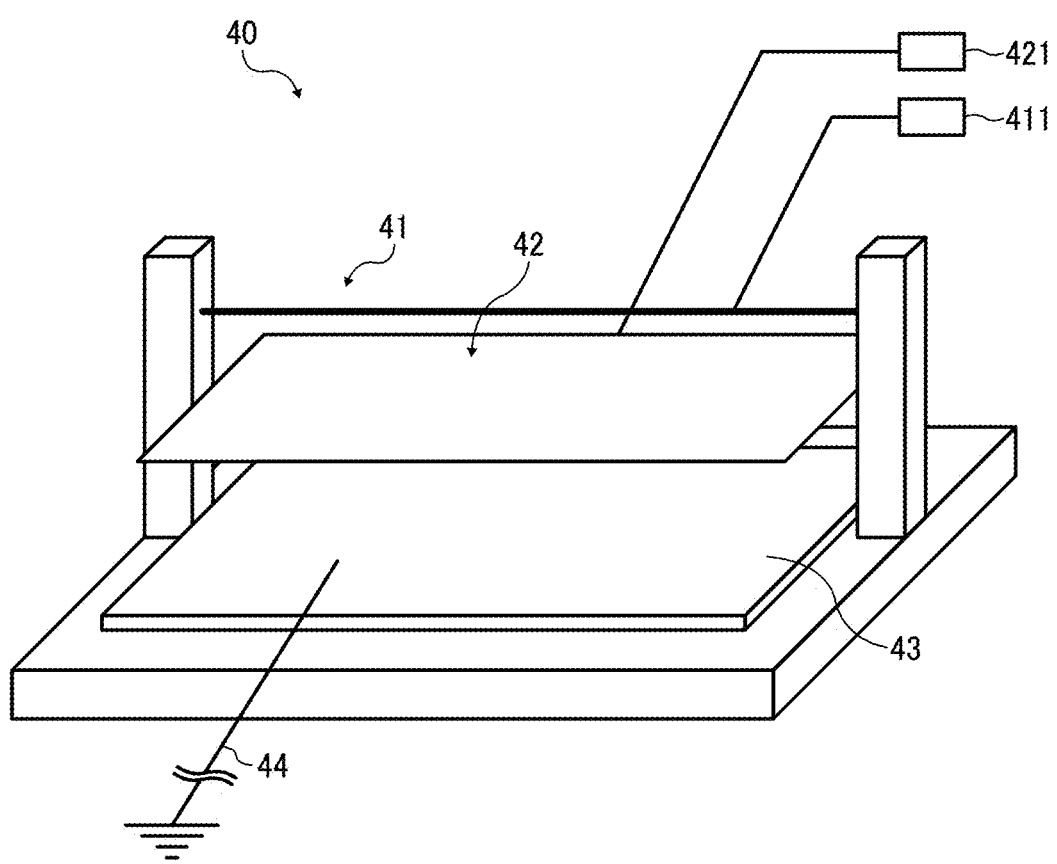
FIG. 4 is a perspective view of a schematic configuration example of a polarization processing device according to an embodiment of the present disclosure.

FIG. 4 is a perspective view of a schematic configuration example of a polarization processing device 40 used to perform polarization processing on a piezoelectric film 24 in a production process of the piezoelectric element 200, according to an embodiment of the present disclosure. In FIG. 4, the polarization processing device 40 includes a corona electrode 41, a grid electrode 42, and a stage 43 including opposed electrodes. The corona electrode 41 and the grid electrode 42 are connected to a corona electrode power supply 411 and a grid electrode power supply 421, respectively.

The corona electrode 41 may have, e.g., a shape of a wire. The grid electrode 42 is mesh-processed and configured so that, when a high voltage is applied to the corona electrode 41, ions, electric charges, and so on generated by corona discharge effectively fall onto a sample stage. The stage 43 to set a sample thereon may be connected to a ground wire 44 to facilitate electric charge to flow into a sample (the piezoelectric element 200) being a target of electric discharge. The stage 43 may have a temperature adjustment capability to heat the piezoelectric element 200. In such a case, heating temperatures are not limited to a particular range. However, for example, the stage 43 may be configured to heat the piezoelectric element 200 to 350° as a maximum temperature.

The magnitude of the voltage applied to each of the corona electrode 41 and the grid electrode 42 and the distance between the sample and each electrode are not limited in particular. For example, to sufficiently perform polarization processing on the sample, the magnitude of the voltage applied to each of the corona electrode 41 and the grid electrode 42 and the distance between the sample and each electrode may be adjusted in accordance with the sample to adjust the intensity of the corona discharge.

Figure 5:
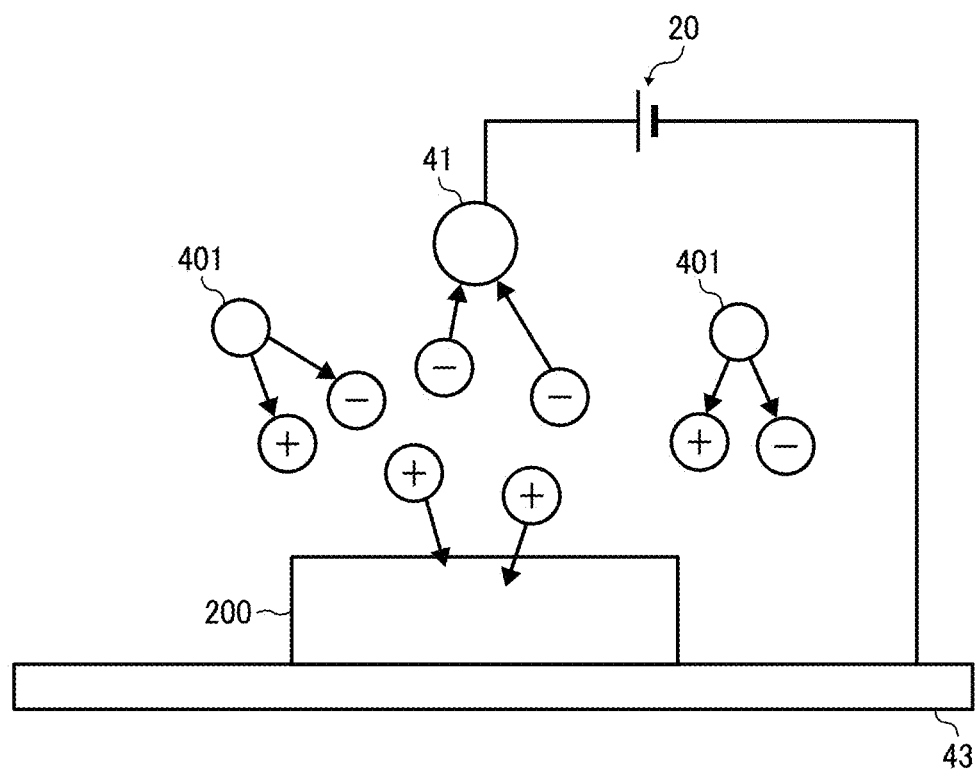
FIG. 5 is an illustration of polarization processing in the polarization processing device of FIG. 4.

FIG. 5 is an illustration of polarization processing in the polarization processing device 40. As illustrated in FIG. 5, if corona discharge is generated with the corona electrode 41 (e.g., corona wire), polarization processing ionizes atmospheric molecules 401, thus generating positive ions. The positive ions generated flow into the piezoelectric film 24 through, for example, a common electrode pad and a discrete electrode pad of the piezoelectric element 200, thus causing a stage in which electric charge is accumulated in the piezoelectric element 200. Accordingly, an internal potential difference is caused by a difference in charge between the upper electrode and the lower electrode, thus causing polarization processing to be performed.

The amount of charge required for the above-described polarization processing is not limited to any particular amount. However, for example, an amount of charge not less than $1.0 \times 10^{-8}$ [C] may be accumulated in the piezoelectric element 200. Alternatively, for example, an amount of charge not less than $4.0 \times 10^{-8}$ [C] may be accumulated in the piezoelectric element 200. Accumulating an amount of charge in such a range in the piezoelectric element 200 allows polarization processing to be performed to more reliably obtain a polarization rate as described later. If the amount of charge accumulated is less than $1.0 \times 10^{-8}$ [C], sufficient performance might not be obtained for the deterioration of displacement after continuous driving of the piezoelectric element 200.

The state of polarization processing of the piezoelectric element 200 can be determined from a P-E hysteresis loop of the piezoelectric element 200.

Figure 6A:
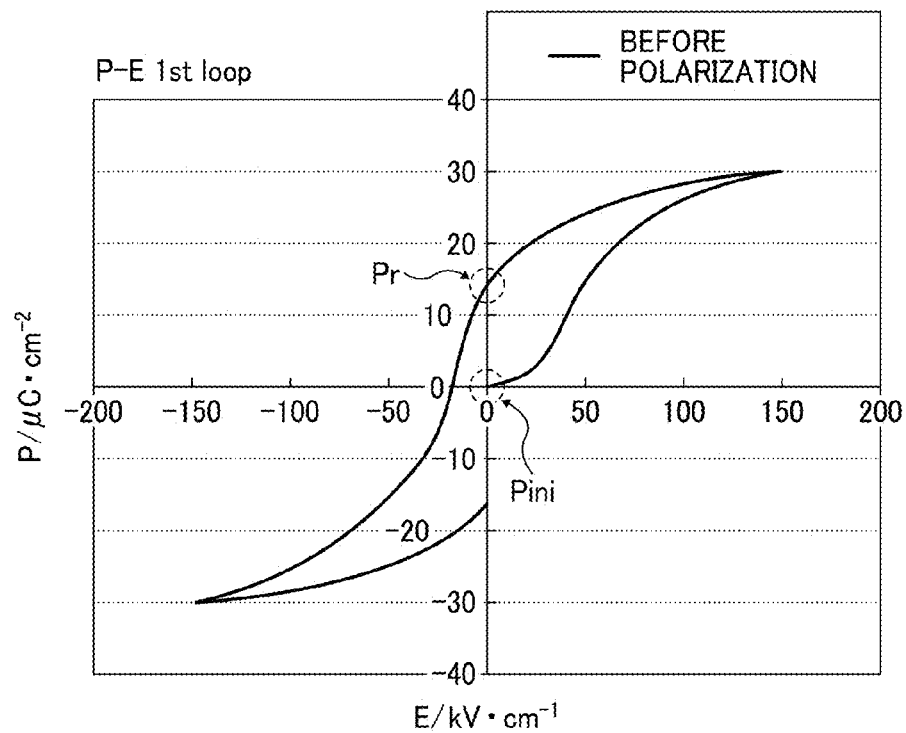
FIG. 6A is a characteristic diagram of a measurement example of a P-E hysteresis loop of the piezoelectric element before the polarization processing.
Figure 6B:
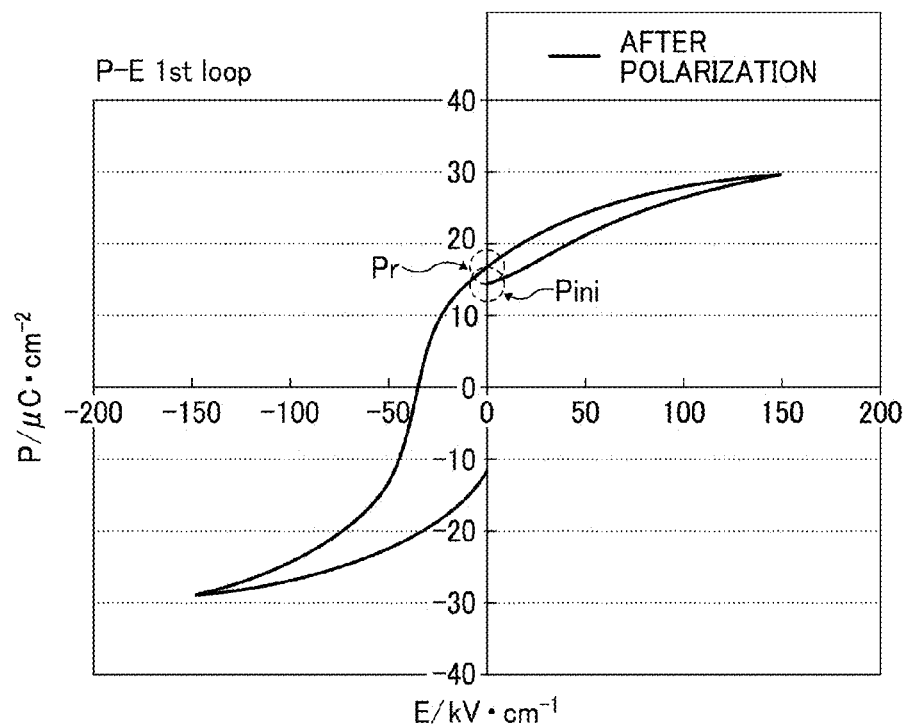
FIG. 6B is a characteristic diagram of a measurement example of a P-E hysteresis loop of the piezoelectric element after polarization processing.

FIGS. 6A and 6B are graphs of examples of P-E hysteresis loop to determine the state of polarization processing of the Piezoelectric element 200. FIG. 6A is a characteristic diagram of an example of P-E hysteresis loop of the piezoelectric element 200 before polarization processing is performed. FIG. 6B is a characteristic diagram of an example of P-E hysteresis loop of the piezoelectric element 200 after polarization processing is performed.

As illustrated in FIGS. 6A and 6B, when hysteresis loop is measured with an intensity of electric field of±150 kV/cm applied to the piezoelectric element 200 by application of voltage, Pini represents a polarization at 0 kV/cm before application of voltage to the piezoelectric element 200. Pr represents a polarization at 0 kV/cm when the intensity of electric field is returned to 0 kV/cm after a voltage of 150 kV/cm is applied to the piezoelectric element 200. Here, the value of Pr-Pini is defined as "polarization rate". Based on the polarization rate, it can be determined whether the state of polarization is proper. For example, as illustrated in FIG. 6B, when the value of polarization rate of Pr-Pini measured in the piezoelectric element 200 after polarization processing is not greater than a predetermined value, it can be determined that the state of polarization is proper.

For example, when the value of polarization rate of Pr-Pini is not greater than 10 µC/cm$^2$, it can be determined that the state of polarization is proper. Alternatively, when the value of polarization rate of Pr-Pini is not greater than 5 µC/cm$^2$, it can be determined that the state of polarization is proper. When the value of Pr-Pini is not sufficiently small, polarization is not sufficiently performed, thus causing a state in which the amount of deformation (the amount of surface displacement) of the piezoelectric element 200 relative to a predetermined drive voltage is unstable. In addition, degradation of the amount of deformation (the amount of surface displacement) of the piezoelectric element 200 after continuous driving may not be sufficiently suppressed.

Next, a description is given of an example of components of the piezoelectric element 200 according to this embodiment. As described above, the piezoelectric element 200 according to this embodiment is formed on the substrate 21 with the diaphragm 22 interposed in between. Materials of the substrate 21 are not limited to any particular materials. However, in consideration of ease of processing, availability, and so on, for example, a monocrystalline silicon substrate is preferably used as the substrate 21. There are three types of plane orientations, {100}, {110}, and {111}, for such a monocrystalline silicon substrate. The plane orientation of the present embodiment is not limited to any one but a proper substrate is selectable in accordance with the content of processing.

For example, when the substrate 21 is processed by etching, a substrate having a predetermined plane orientation is selectable in accordance with the content of etching. Taking an example of producing a liquid discharge head 104 described later, generally, a substrate is processed by etching to form a pressure chamber 80. In such a case, as a method of etching, typically, anisotropic etching is employed. Anisotropic etching utilizes properties in which the etching rate is different between plane orientations of a crystal structure.

For example, in the anisotropic etching in which the substrate is immersed in an alkaline solution, such as KOH, the etching rate of a {111} plane is about 1/400 of the etching rate of a {100} plane. Therefore, a structure having an inclination of about 54° can be produced in the plane orientation {100}. On the other hand, a deep groove can be formed in the plane orientation {110}, thus an array density to be increased while rigidity is maintained. Accordingly, for example, for a substrate forming a liquid discharge head 104, a monocrystalline silicon substrate having a {110} plane orientation is preferably used.

The thickness of the substrate 21 is selectable in accordance with usage and so on and is not limited to any particular range. However, for example, the thickness of the substrate 21 may be 100 µm to 600 µm.

When the diaphragm 22 forms the liquid discharge head 104 described later, the diaphragm 22 as a base film receives a force generated by the piezoelectric element 200 and deforms (the surface of the diaphragm 22 deforms) to discharge droplets of ink from a pressure chamber. Accordingly, the base film may have a predetermined strength. As the materials of the diaphragm 22, for example, Si, SiO$_2$, and Si$_3$N$_4$ are prepared according to a chemical vapor deposition (CVD) method. Further, a material may be selected having a linear expansion coefficient close to a linear expansion coefficient of at least one of the lower electrode 23 and the piezoelectric film 24 illustrated in FIG. 1. As a material of the piezoelectric film 24, in which PZT is typically used, the diaphragm 22 may be made of a material having a linear expansion coefficient of from $5\times10^{-6}$ to $10\times10^{-6}$(1/K) close to a linear expansion coefficient of PZT, which is $8\times10^{-6}$ (1/K). Alternatively, for example, the diaphragm 22 may be made of a material having a linear expansion coefficient of from $7\times10^{-6}$ to $9\times10^{-6}$.

Examples of the material of the diaphragm 22 include aluminum oxide, zirconium oxide, iridium oxide, ruthenium oxide, tantalum oxide, hafnium oxide, osmium oxide, rhenium oxide, rhodium oxide, palladium oxide, and compounds of the foregoing materials. With such materials, the diaphragm 22 is produced by a spin coater using a sputtering method or a sol-gel method. The film thickness of the diaphragm 22 may be in a range of from 0.1 µm to 10 µm or in a range of from 0.5 µm to 3 µm. If the film thickness is smaller than such a range, the processing on the pressure chamber may not be easily performed. By contrast, if the film thickness is greater than such a range, the diaphragm 22 is unlikely to deform as the base film. When the diaphragm 22 is used in a liquid discharge apparatus 500, the discharge of droplets (ink droplets) might be unstable.

A membrane stress of the diaphragm 22 influences membrane property (crystallinity) of the piezoelectric film 24 formed on the diaphragm 22. The membrane stress of the diaphragm 22 can be calculated by feinting single-layer films made of material such as Si on the substrate 21 and evaluating an amount of deformation before and after the formation of the single-layer films It is preferable to design the membrane stress of the diaphragm 22 such that the diaphragm 22 has a convex shape protruding upward when looking the deformation of the substrate 21 just after the lamination of all the single-layer films that form the diaphragm 22 on the substrate 21. Thus, it is preferable to select material of each single-layer films such that the diaphragm 22 as whole has a compressive stress.

This is because many materials used for the piezoelectric film 24 and the lower electrode 23 have a tension stress. For example, the PZT film has a tensile stress when PZT is used for manufacturing the piezoelectric film 24. A platinum (Pt)

film has a tensile stress when Pt film is used for manufacturing the lower electrode 23. By forming the diaphragm 22 with the single-layer films having compressive inner stress as a whole, the diaphragm 22 can cancel the tensile stress of the PZT film and the Pt film Thus, an actuator having a preferable quality can be obtained.

Thus, the diaphragm 22 is formed with laminated films that include at least one layer of a single-layer film having a compressive stress. Thus, the diaphragm 22 includes laminated films including both of the single-layer film having a compressive stress and a single-layer film having tensile stress. The diaphragm 22 may include laminated films having only the compressive stress.

The lower electrode 23 and the upper electrode 25 are not limited to any particular materials but any proper materials are selectable. For example, the lower electrode 23 and the upper electrode 25 may be made of a metal film and an oxide electrode film, or in particular, may be made of a lamination of a metal film and an oxide electrode film. As illustrated in FIG. 2, the lower electrode 23 and the upper electrode 25 may include the metal layer 231 and the metal layer 252, respectively, of sufficiently small electrical resistances.

Examples of a metal material of the metal layer 231 and the metal layer 252 include platinum having high heat-resistance and low reactivity. However, platinum may not have a sufficient barrier property against lead. Accordingly, platinum group elements, such as iridium and platinum-rhodium, or alloy films thereof may be used for the metal layer 231 and the metal layer 252. When platinum is used, adhesion of platinum with a base (in particular, $SiO_2$) is poor. Therefore, for example, Ti, $TiO_2$, Ta, $Ta_{2O5}$, or $Ta_3N_5$ is preferably laminated in advance as an intervening layer. Examples of a method of producing the metal film include a sputtering method and a vacuum vapor deposition method. The film thickness may be set in a range of from 0.05 μm to 1 μm or a range of from 0.1 μm to 0.5 μm.

As illustrated in FIG. 2, the lower electrode 23 and the upper electrode 25, respectively, may include the oxide electrode layer 232 and the oxide electrode layer 251 each having conductivity at an interface with the piezoelectric film 24. Examples of a material of the oxide electrode layer 232 and the oxide electrode layer 251 include $SrRuO_3$ and $LaNiO_3$. The method of film formation of the oxide electrode layer 232 and the oxide electrode layer 251 is not limited to any particular method. For example, the oxide electrode layer 232 and the oxide electrode layer 251 may be formed by a sputtering method.

The oxide electrode layer 232 forming the lower electrode 23 affects the control of orientation of the piezoelectric film 24 that is formed on the oxide electrode layer 232. Accordingly, materials to be selected are different in accordance with the preferential orientation. In this embodiment, since the plane orientation of the piezoelectric film 24 to be preferentially oriented is {100} plane, the piezoelectric film 24 may be formed after a seed layer made of $LaNiO_3$, $TiO_2$, or $PbTiO_3$ as the oxide electrode layer 232 is formed on the metal layer 231.

An example of a material of the oxide electrode layer 251 forming the upper electrode 25 is $SrRuO_3$ (SRO). The film thickness of the oxide electrode layer 251 may be in a range of from 20 nm to 80 nm or in a range of from 30 nm to 50 nm. If the film thickness is smaller than such a range, a sufficient characteristic is not obtained in the initial amount of deformation (the amount of surface displacement) or the degradation characteristic of the amount of deformation (the amount of surface displacement). By contrast, if the film thickness is larger than such a range, a dielectric strength voltage of the subsequently formed piezoelectric film 24 is very low and leakage might occur easily.

An example of a material of the piezoelectric film 24 is an oxide including Pb (for example, PZT). The PZT is a solid solution of lead zirconate ($PbTiO_3$) and titanium acid ($PbTiO_3$) and has a property difference according to a ratio of the lead zirconate ($PbTiO_3$) and the titanium acid ($PbTiO_3$). In a composition present a generally superior piezoelectric property, a ratio of $PbZrO_3$ and $PbTiO_3$ is 53:47. If the composition is represented by a chemical formula, the composition is represented by Pb ($Zr_{0.53}Ti_{0.47}$) $O_3$, generally, PZT (53/47).

Another example of a material of the piezoelectric film 24 is barium titanate as a composite oxide other than the PZT. In such a case, barium alkoxide and titanium alkoxide compounds are used as a starting material and are dissolved in a common solvent, to prepare a barium titanate precursor solution.

In this embodiment, an example is described in which the piezoelectric film 24 is made of PZT and the {100} plane of PZT is preferentially oriented. In such a case, the composition ratio of Zr and Ti, that is, Ti/(Zr+Ti) may be set not less than 0.45 (45%) and not greater than 0.55 (55%) or not less than 0.48 (48%) and not greater than 0.52 (52%).

The method of producing the piezoelectric film 24 is not limited to any particular method. For example, the piezoelectric film 24 may be produced by a spin coater using, for example, a sputtering method or a sol-gel method. In any case, patterning is necessary and is performed by, for example, photolithoetching to obtain a desired pattern.

When the sol-gel method is used, the piezoelectric film 24 is produced according to, for example, the following procedure. For example, lead acetate, zirconium alkoxide, and titanium alkoxide compound are used as starting materials and are dissolved in methoxyethanol as a common solvent to obtain a uniform solution. Thus, a PZT precursor solution can be prepared. Since a metal alkoxide compound is easily hydrolyzed by atmospheric water, a stabilizer, such as acetylacetone, acetic acid, or diethanolamine may be appropriately added to the PZT precursor solution.

When the piezoelectric film 24 is formed on an entire surface of the base substrate in which the lower electrode is formed, the piezoelectric film 24 is obtained by forming a coating by a solution coating method, such as a spin coating method, and performing each heat treatment of solvent drying, thermal decomposition, and crystallization on the coating. When the coated film is transformed to the crystallized film, the volume of the film contracts. Thus, to obtain a crack-free film, the precursor density is preferably adjusted to obtain a film thickness not greater than 100 nm in one-time process.

Alternatively, in the production according to an inkjet method, a patterned film can be obtained by a production flow similar to a production flow of the oxide electrode layer 232. A surface modifier is selected in accordance with a material of the metal layer 231 as a base of the surface modifier. When an oxide is used as the base of the surface modifier, mainly a silane compound is selected as the surface modifier. When a metal is used as the base, mainly alkanethiol is selected.

The film thickness of the piezoelectric film 24 is not limited to a particular thickness but is selectable in accordance with the amount of deformation (the amount of surface displacement). For example, the film thickness may be in a range of from 0.5 μm to 5 μm or in a range of from 1 μm to 2 μm. A film thickness in such a range generates a sufficient amount of deformation (the amount of surface displacement). With a film thickness in such a range, the number of steps for laminating layers to form the piezoelectric film 24 does not unnecessarily increase, thus allows production with good productivity.

The first insulating protective film 31, the second insulating protective film 38, the connector 35, and the inter-pad connector 37 are produced, for example, as follows.

The first insulating protective film 31 may be made of a material that is impermeable to moistures in the atmosphere and prevents damage to the piezoelectric element 200 in the steps of film formation and etching. Accordingly, for example, dense inorganic material (inorganic compound) may be used. As the first insulating protective film 31, an oxide, nitride, or carbonized film may be used to obtain a high degree of protection performance with a thin film. The first insulating protective film 31 may be made of a material highly adhesive to a material of a base (a material of the upper electrode 25, the lower electrode 23, and the piezoelectric film 24, or a material of an upper surface of the substrate 21) contacting the first insulating protective film 31. Examples of such a material include an oxide film used for ceramic materials, such as $Al_2O_3$, $ZrO_2$, $Y_2O_3$, $Ta_2O_3$, and $TiO_2$ are exemplified.

The method of film formation of the first insulating protective film 31 is not limited to any particular method. For example, a method of film formation that does not damage the piezoelectric element 200 is selected as the method. For example, a vapor deposition method or an atomic layer deposition (ALD) method may be used. In particular, film formation may be performed according to the ALD method that is advantageous in that the number of selectable materials is greater. In particular, according to the ALD method, a thin film with quite high film density is produced, thus reducing damage to the piezoelectric element 200 in the production steps.

The film thickness of the first insulating protective film 31 is not limited to any particular thickness. However, the first insulating protective film 31 has a thickness sufficient to obtain a protection performance of the piezoelectric element 200 and is small enough not to hamper the displacement of the piezoelectric element 200. For example, the film thickness of the first insulating protective film 31 may be not less than 20 nm and not greater than 100 nm. A film thickness greater than 100 nm may hamper the displacement of the piezoelectric element 200. By contrast, a film thickness smaller than 20 nm may not provide sufficient protection of the piezoelectric element 200 and the performance of the piezoelectric element 200 may decrease.

The first insulating protective film 31 may be formed of a plurality of layers. For example, when the first insulating protective film 31 is formed of two layers, to construct the second layer of the first insulating protective film 31 relatively thicker, an opening may be formed near the upper electrode in the second layer of the first insulating protective film 31 so as not to significantly hamper the vibration displacement of the piezoelectric element 200. As the second layer of the first insulating protective film 31, any oxide, nitride, and carbide or a composite compound thereof can be used. For example, $SiO_2$, which is typically used in a semiconductor device, may be used.

The film formation may be any suitable method. For example, the CVD method or sputtering method may be used for film formation. In particular, if the step coating of a pattern forming part, such as an electrode forming part, is considered, the CVD method capable of isotropically forming a film may be used. The film thickness of the second layer of the first insulating protective film 31 is not limited to any particular film thickness. In consideration of the voltage applied to each electrode, a film thickness not dielectrically broken down is selectable. For example, the intensity of electric field applied to the first insulating protective film 31 is set in a range in which the insulating protective film is not dielectrically broken down. In consideration of the surface properties or pin holes of the base of the first insulating protective film 31, the film thickness may be not less than 200 nm or may be not less than 500 nm.

Materials of the connector 35 and the inter-pad connector 37 are not limited to any particular materials but various types of conductive materials are usable. For example, each of the connector 35 and the inter-pad connector 37 may be made of any metal electrode material selected from Cu, Al, Au, Pt, Ir, Ag alloy, and Al alloy.

The method of producing the connector 35 and the inter-pad connector 37 is not limited to any particular method but any particular method can be used. The connector 35 and the inter-pad connector 37 are produced by, for example, the sputtering method or the spin coating method and a desired pattern is obtained by, for example, photolithographic etching.

The film thickness of each of the connector 35 and the inter-pad connector 37 is not limited to any particular thickness but may be, for example, not less than 0.1 μm and not greater than 20 μm or not less than 0.2 μm and not greater than 10 μm. If the film thickness is smaller than a film thickness in such a range, resistance increases and may hamper a sufficient current from flowing to the electrode. If the film thickness is greater than a film thickness in such a range, it takes a longer time in the production process and may reduce the productivity.

When the first insulating protective film 31 is provided, a contact-hole portion for the connector 35 and the inter-pad connector 37 is disposed in the first insulating protective film 31 so that the connector 35 and the inter-pad connector 37 can be connected to the common electrode and the discrete electrode at the contact-hole portion. The dimension of the contact-hole portion is not limited to any particular size but may be, for example, 10 μm×10 μm. As the contact resistance of the contact-hole portion, the common electrode may have a contact resistance of, for example, not greater than 10Ω and the discrete electrode may have a contact resistance of, for example, not greater than 1Ω. Such a range allows stable supply of a sufficient current to each electrode.

Alternatively, the common electrode may have a contact resistance of not greater than 5Ω and the discrete electrode may have a contact resistance of not greater than 0.5 Ω. With a contact resistance greater than such a range, when the piezoelectric element 200 is used in the liquid discharge head 104 (see FIG. 12), a sufficient electric current may not be supplied and may cause a failure in discharging droplets.

The second insulating protective film 38 is a passivation layer having a function of protecting the connector 35 and the inter-pad connector 37. The second insulating protective film 38 covers the connector 35 and the inter-pad connector 37, except for areas of the discrete electrode pad 34 and the common electrode pad 36. Even when low cost Al or an alloy material including Al as main ingredient is used for the connector 35 and the inter-pad connector 37, such a configuration enhances the reliability of the piezoelectric element 200. In addition, since low cost materials are used for the connector 35 and the inter-pad connector 37, the cost of the piezoelectric element 200 is reduced.

The material of the second insulating protective film 38 is not limited to any particular material but any inorganic material or any organic material can be used. For example, a material with low moisture permeability may be used. Examples of inorganic material include oxide, nitride, and carbide. Examples of organic material include polyimide, acrylic resin, and urethane resin. However, for organic material, to function as the insulating protective film, the film thickness may be relatively thick and patterning may not be easily performed. Accordingly, an inorganic material may be used that has a function of protecting wiring in a thin film When Al wiring is used as the connector 35 and the inter-pad connector 37, for example, $Si_3N_4$, which is widely used in semiconductor devices, may be used as the second insulating protective film 38.

The film thickness of the second insulating protective film 38 may be, for example, not less than 200 nm or not less than 500 nm. If the film thickness is smaller than such a range, a sufficient passivation performance is not obtained. For example, breaking due to corrosion of the connector may cause a reduction in reliability.

The second insulating protective film 38 may have openings above the piezoelectric elements 200. When the piezoelectric element 200 is applied to the liquid discharge head 104, the second insulating protective film 38 may have openings above the diaphragm 22. Such a configuration allows the piezoelectric element 200 to be more efficient and more reliable.

The second insulating protective film 38 may have openings to expose the common electrode pad 36 and the discrete electrode pad 34. The openings are formed by, for example, a photolithography method, or dry etching.

The area of each of the common electrode pad 36 and the discrete electrode pad 34 is not limited to any particular size. When polarization processing is performed after formation of the common electrode pad 36, the discrete electrode pad 34, and the second insulating protective film 38, electric charge is supplied from each of the common electrode pad 36 and the discrete electrode pad 34. Therefore, for example, the area of each of the common electrode pad 36 and the discrete electrode pad 34 may be set to such a size that polarization processing is fully performed. For example, each of the common electrode pad 36 and the discrete electrode pad 34 may have not less than a size of 50 μm×50 μm or may have not less than a size of 100 μm×300 μm. If the area of the common electrode pad 36 and the discrete electrode pad 34 is smaller than the above-described range, the polarization processing may not be sufficiently performed and the degree of degradation of the amount of deformation (the amount of surface displacement) may increase over time after continuous driving.

Next, a description is given of a relationship between crystal orientation of the piezoelectric film 24 and properties as the piezoelectric element 200 in this embodiment.

In the present disclosure, the "orientation rate" of a particular crystal plane oriented perpendicular to the thickness direction of the piezoelectric film 24 is defined by the following measurement. That is, θ-2θ scanning measurement using X-ray diffraction (XRD) is performed on the piezoelectric film 24. Then, the area of a peak corresponding to the particular crystal plane observed on a 2θ spectrum curve and the area of each of all peaks or main peaks observed on the 2θ spectrum curve are determined. The "orientation rate" of the particular crystal plane is represented by a percentage of a value obtained by dividing the area of the peak corresponding to the particular crystal plane by a sum of the areas of all peaks or main peaks.

Note that, in the present disclosure, the term {hkl} plane is representative of an (hkl) plane and a plurality of crystal planes equivalent to the (hkl) plane from a symmetry without considering a direction of voluntary polarization in crystallization of a piezoelectric material. The {hkl} plane may be any one crystal plane of the (hkl) plane and the plurality of crystal planes equivalent to the (hkl) plane or any two or more crystal planes selected from the (hkl) plane and the plurality of crystal planes equivalent to the (hkl) plane. For example, in a piezoelectric body having a crystal structure of perovskite, the term {111} plane represents any one plane or any two or more crystal planes of a plurality of crystal planes including a (111) plane and another seven crystal planes equivalent to the (111) plane. The term {100} plane represents any one plane or any two or more crystal planes of a plurality of crystal planes including a (100) plane and another five crystal planes equivalent to the (100) plane.

In the present disclosure, the term {hlk} orientation indicates that the {hkl} plane is oriented perpendicular to a thickness direction of the film. The term (hkl) orientation indicates that the (hkl) plane is oriented perpendicular to the thickness direction of the film. For example, the terms {100} orientation indicates that the {100} plane is oriented perpendicular to the thickness direction of the film. The term {111} orientation indicates that the {111} plane is oriented perpendicular to the thickness direction of the film. The term {200} orientation indicates that the {200} plane is oriented perpendicular to the thickness direction of the film.

In the present disclosure, the degree of orientation ρ{hkl} of the {hkl} plane of the piezoelectric film 24 is defined by the formula of ρ{hkl}=I{hkl}/ΣI{hkl}. Here, I{hkl} is a peak intensity of a diffraction peak derived from a given {hkl} plane obtained by the θ-2θ scanning measurement of the X-ray diffraction (XRD) method on the piezoelectric film 24. ΣI{hkl} is a total sum of peak intensities of a plurality of diffraction peaks obtained by the θ-2θ scanning measurement of the X-ray diffraction (XRD) method on the piezoelectric film 24.

Figure 7:
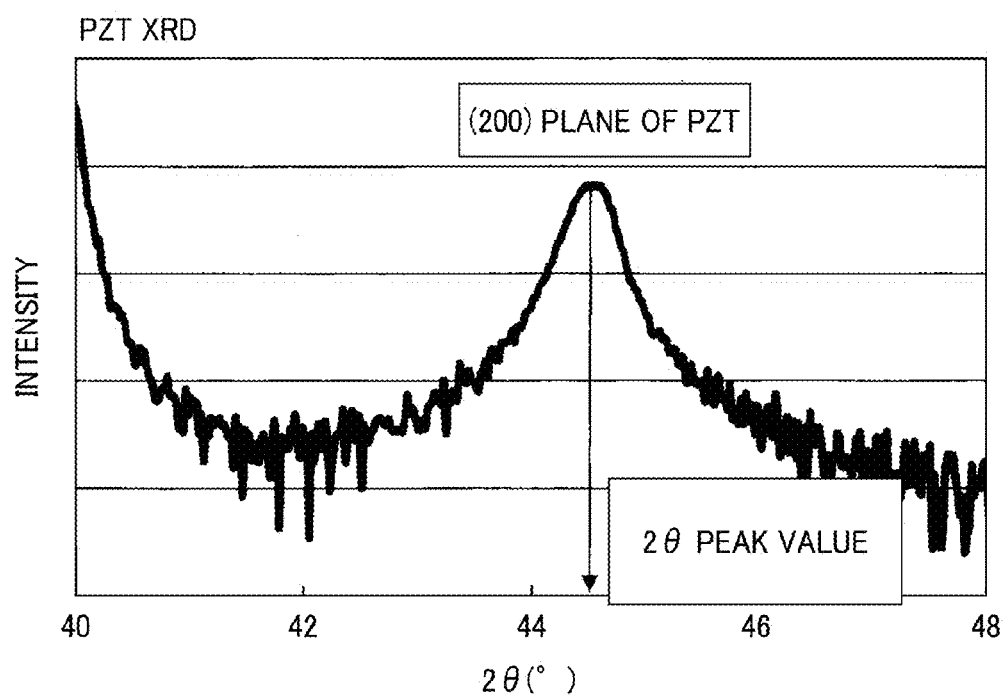
FIG. 7 is a graph of diffraction peak position on {200} plane of the piezoelectric film obtained by θ-2θ scanning measurement by X-ray diffraction.

FIG. 7 is a graph of diffraction peak position on {200} plane of the piezoelectric film 24 obtained by the θ-2θ scanning measurement of the X-ray diffraction (XRD) method. In FIG. 7, the horizontal axis represents the value of 2θ in the θ-2θ scanning measurement of the X-ray diffraction (XRD) method. The vertical axis represents the diffraction intensity measured at each 2θ. Through experiments and investigations, the present inventors have found that, as the composition ratio of Zr/Ti in PZT changes, as illustrated in FIG. 7, the 2θ peak position (diffraction peak position) corresponding to the {200} plane of the piezoelectric film 24 (hereinafter, referred to as "PZT {200} plane") and the peak asymmetry also change. From the results, by adjusting various parameters in the production process so that the 2θ peak position and the peak asymmetry of the PZT {200} plane at a high angle side are optimal, the amount of deformation (the amount of surface displacement) is obtained that preferably maintains droplet discharge properties when the piezoelectric film 24 is used for the liquid discharge head 104.

The diffraction peak position (2θ) of the PZT {200} plane may be not less than 44.50° and not greater than 44.80° or may be not less than 44.65° and not greater than 44.75° in a state in which the piezoelectric film 24 is constrained by the substrate 21 as a base.

When the liquid discharge head 104 is formed (see FIG. 12) in a state, in which liquid chambers, such as the pressure chambers 80, are formed, the piezoelectric film 24 is not constrained by the substrate 21. In such a case, since the crystal lattice extends in a vertical direction to a plane of the substrate 21, the diffraction peak position (2θ) of the PZT {200} plane is smaller. The diffraction peak position (2θ) of the PZT {200} plane may be not less than 44.45° and not greater than 44.75°, or may be not less than 44.55° and not greater than 44.70° in a state in which the piezoelectric film 24 is not constrained by the substrate 21.

If the composition ratio of Zr/Ti in PZT is smaller than the above-described predetermined range or the 2θ position (diffraction peak position) of the PZT {200} plane is smaller than the above-described predetermined range, the amount of deformation (the amount of surface displacement) accompanying a rotational distortion described later decreases. Accordingly, the amount of deformation (the amount of surface displacement) of the piezoelectric element 200 may not be sufficiently obtained. By contrast, if the composition ratio of Zr/Ti in PZT is greater than the above-described predetermined range or the 2θ peak position (diffraction peak position) of the PZT {200} plane is greater than the above-described predetermined range, the amount of deformation (the amount of surface displacement) accompanying a rotational distortion also decreases. Accordingly, the amount of deformation (the amount of surface displacement) of the piezoelectric element 200 may not be sufficiently obtained.

Figure 8:
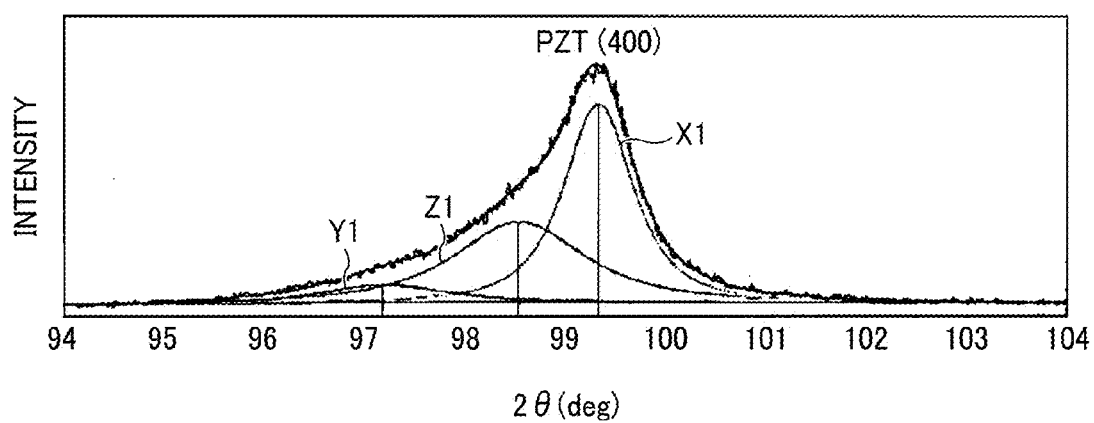
FIG. 8 is a graph of results of peak separation performed focusing on diffraction peaks derived from {400} plane of the piezoelectric film.

FIG. 8 is a graph of results of peak separation performed focusing on diffraction peaks derived from {400} plane of the piezoelectric film 24 obtained by the θ-2θ scanning measurement of the X-ray diffraction (XRD) method. In FIG. 8, the horizontal axis represents the value of 2θ in the θ-2θ scanning measurement of the X-ray diffraction (XRD) method. The vertical axis represents the diffraction intensity measured at each 2θ.

Focusing on a diffraction peak derived from the {400} plane, a peak separation is performed on an piezoelectric film 24 having a 2θ position (diffraction peak position) adjusted within the above-described predetermined range by the above-described composition ratio of Zr/Ti, to identify the attribution state of the crystal structure.

A great degree of asymmetry of the diffraction peak illustrated in FIG. 8 attributes to any one of three crystal structures. Specifically, such a great degree of asymmetry attributes to three crystal structures: a tetragonal a-domain structure X1, a tetragonal c-domain structure Y1, and a mixed structure Z1 of any one of a rhombohedral structure, an orthorhombic structure, and a pseudo-cubic structure.

Here, the term "a-domain" represents a domain in which an a-axis of the perovskite crystal (PZT crystal) is parallel to a film thickness direction of the piezoelectric film 24 among a plurality of types of domains included in a perovskite crystal (PZT crystal) of the piezoelectric film 24,. Here, the term "c-domain" represents a domain in which a c-axis (spontaneous polarization axis) of the perovskite crystal (PZT crystal) is parallel to the film thickness direction. The term "a-domain structure X1" represents the crystal structure of a-domain. The term "c-domain structure Y1 " represents the crystal structure of c-domain In the above-described crystal structures, in the ratio of the tetragonal a-domain structure X1 and the tetragonal c-domain structure Y1, for each area of a plurality of diffraction peaks separated, Sa represents the diffraction peak area attributing to the tetragonal a-domain structure X1 and Sc represents a diffraction peak area attributing to the tetragonal c-domain structure Y1. In this embodiment, the percentage Si of the diffraction peak area Sc in the sum of the diffraction peak area Sa attributing to the a-domain structure X1 and the diffraction peak area Sc attributing to the c-domain structure Y1, S1x=Sc/(Sa+Sc), is called as a domain ratio.

In addition, Sb represents a diffraction peak area attributing to any one of a rhombohedral structure, an orthorhombic structure, and a pseudo-cubic structure. In this embodiment, the percentage S2 of the diffraction peak area Sc in the sum of the diffraction peak area Sa attributing to the a-domain structure X1, the diffraction peak area Sc attributing to the c-domain structure Y1, and the diffraction peak area Sb attributing to the b-domain structure Z1, S2=Sc/(Sa+Sc+Sb), may be called as a domain ratio.

As described above, not only the peak position of the PZT {200} plane, but also the domain ration S1 or the domain ration S2 is different between the state in which the pressure chamber 80 has not been formed (the piezoelectric film 24 is constrained by the substrate 21) and the state in which the pressure chamber 80 has been formed (the piezoelectric film 24 is not constrained by the substrate 21).

Figure 9:
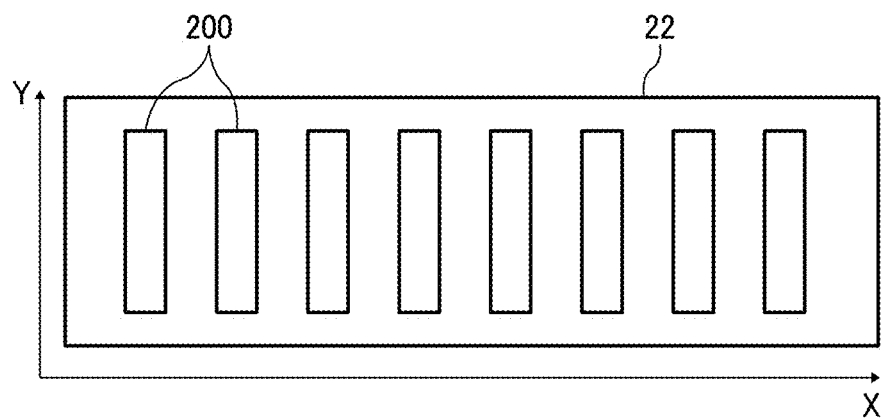
FIG. 9 is a plan view of the piezoelectric element disposed on a diaphragm.

FIG. 9 is a plan view of the piezoelectric element 200 formed (disposed) on the diaphragm 22.

Figure 10:
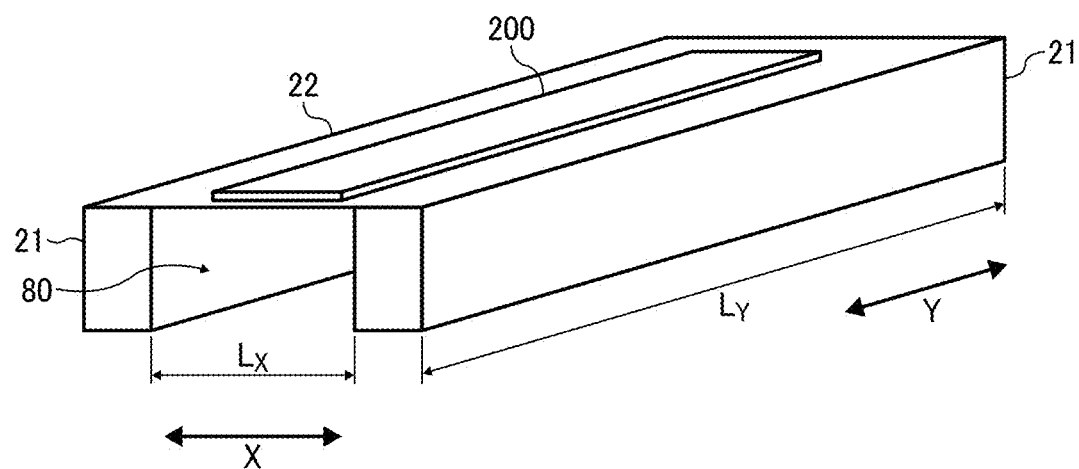
FIG. 10 is a perspective schematic view of a liquid discharge head according to an embodiment of the present disclosure.

FIG. 10 is a perspective view of a part of the liquid discharge head 104 according to an embodiment of the present disclosure. The liquid discharge head 104 includes a through-hole part, which becomes the pressure chamber 80, formed in the substrate 21. The diaphragm 22 and the piezoelectric element 200 are formed (disposed) on the substrate 21. The piezoelectric film 24 is not constrained by the substrate 21 in the state as illustrated in FIG. 10.

The pressure chamber 80 of the present embodiment is formed by forming the through-hole part in the substrate 21, on which the diaphragm 22 and the piezoelectric element 200 are formed (disposed), as illustrated in FIG. 10. The through-hole part has a first length Lx in an X direction as indicated by arrow X in FIG. 10 and has a second length Ly in the Y direction that is direction perpendicular to the X direction as indicated by arrow Y. The second length Ly is longer than the first length Lx.

When the θ-2θ scanning measurement of the X-ray diffraction (XRD) method is performed to obtain the domain ratio S1' of the piezoelectric element 200 in a state in which the through hole part (pressure chamber 80 ) is not formed, the domain ratio S1' of the diffraction peak derived from PZT {200} plane measured by the θ-2θ scanning measurement in any direction is about identical. The domain ratio S1' of the piezoelectric element 200 is isotropic.

However, the domain ration Si of the piezoelectric element 200 is anisotropic when the piezoelectric element 200 is formed (disposed) on the substrate 21 in which the through-hole part (pressure chamber 80 ) is formed. Especially, a domain ratio S1y=Scy/(Say+Scy) and a domain ratio S1x=Scx/(Sax+Scx) are markedly different. The domain ratio S1x is measured such that an incident surface of X-ray in the θ-2θ measurement is parallel to a direction of the first length Lx (X-direction) of the pressure chamber 80. The domain ratio S1y is measured such that an incident surface of X-ray in the θ-2θ measurement is parallel to a direction of the second length Ly (Y-direction) of the pressure chamber 80.

Figure 11:
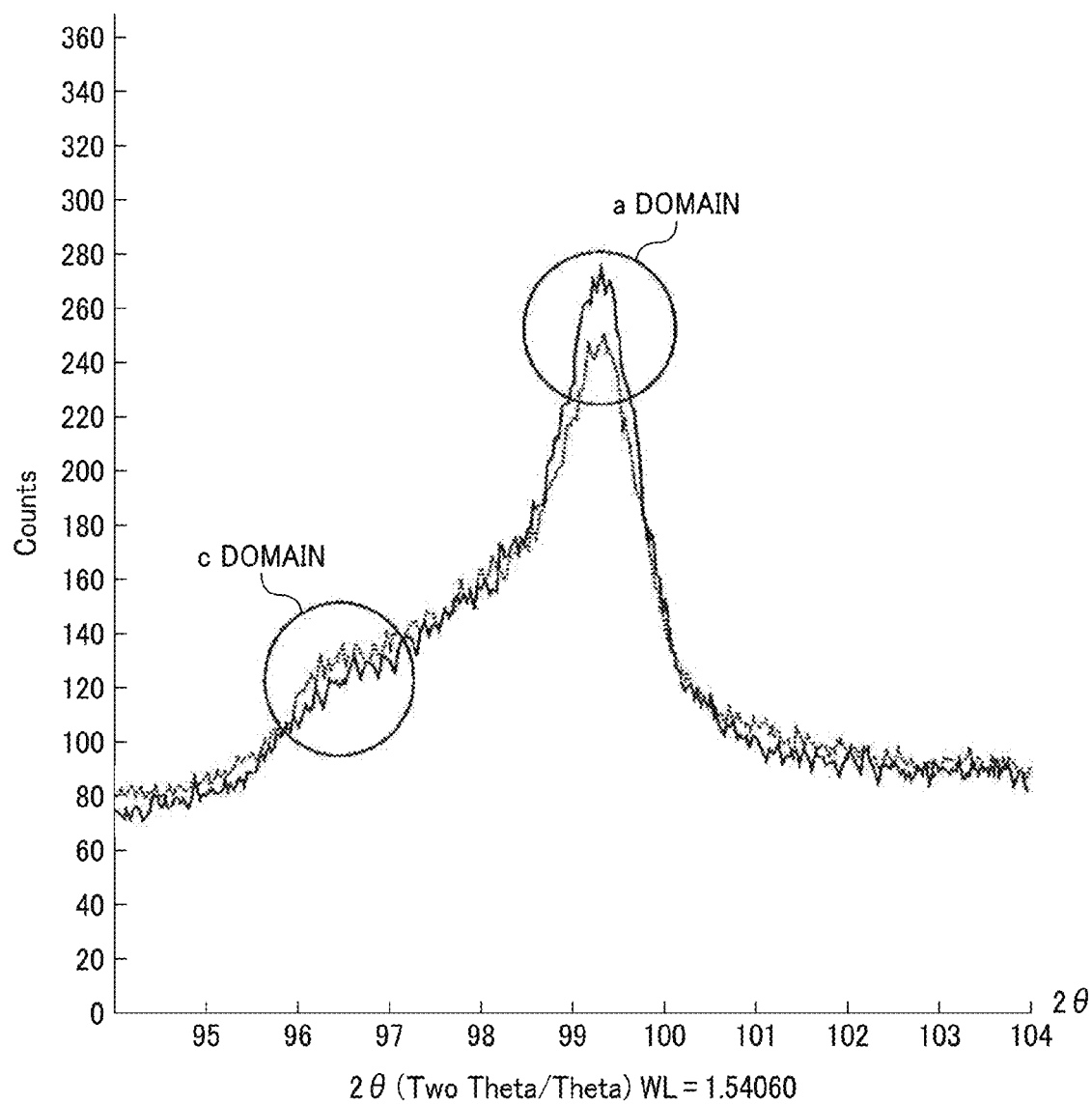
FIG. 11 is a graph illustrating a diffraction intensity distribution derived from {400} plane of the piezoelectric film measured by the θ-2θ scanning measurement according to the X-ray diffraction (XRD) method.

FIG. 11 is a graph illustrating a diffraction intensity distribution derived from {400} plane of the piezoelectric film 24 measured by the θ-2θ scanning measurement according to an X-ray diffraction (XRD) method. In FIG. 11, the diffraction intensity distributions measured in direction parallel to the direction of the first length Lx (X-direction) and the diffraction intensity distributions measured in direction parallel to the direction of the second length Ly (Y-direction) are superimposed and displayed. In FIG. 11, the diffraction intensity distributions measured in direction parallel to the direction of the first length Lx (X-direction) is illustrated by a solid line, and the diffraction intensity distributions measured in direction parallel to the direction of the second length Ly (Y-direction) is illustrated by a broken line.

As illustrated in FIG. 11, when the diffraction intensity distributions is compared with the result measured in the direction parallel to the direction of the first length Lx (X-direction) and the result measured in the direction parallel to the direction of the second length Ly (Y-direction), the diffraction intensity distributions measured in direction parallel to the direction of the second length Ly (Y-direction) is higher than the diffraction intensity distributions measured in direction parallel to the direction of the first length Lx (X-direction) for a diffraction-peak intensity are attributed to a tetragonal a-domain structure X1.

However, the diffraction intensity distributions measured in direction parallel to the direction of the first length Lx (X-direction) is higher than the diffraction intensity distributions measured in direction parallel to the direction of the second length Ly (Y-direction) for a diffraction-peak intensity are attributed to a tetragonal c-domain structure Y1. Therefore, there is a remarkable difference between the domain ratio S1y in the direction of the second length Ly (Y-direction) and the domain ratio S1x in the direction of the first length Lx (X-direction).

Specifically, S1y is smaller than S1x (S1y<S1x). Since there is a difference between the domain ratio S1x in the direction of the first length Lx (X-direction) and the domain ration S1y in the direction of the second length Ly (Y-direction), the piezoelectric constant that influences discharging performance increases. When the ratio of Ly/Lx increases, the difference between the domain ratio S1y and S1x increases, so that the piezoelectric constant that influences discharging performance also increases.

The reason for the difference between the domain ratio S1x and S1y is described below.

Figure 12:
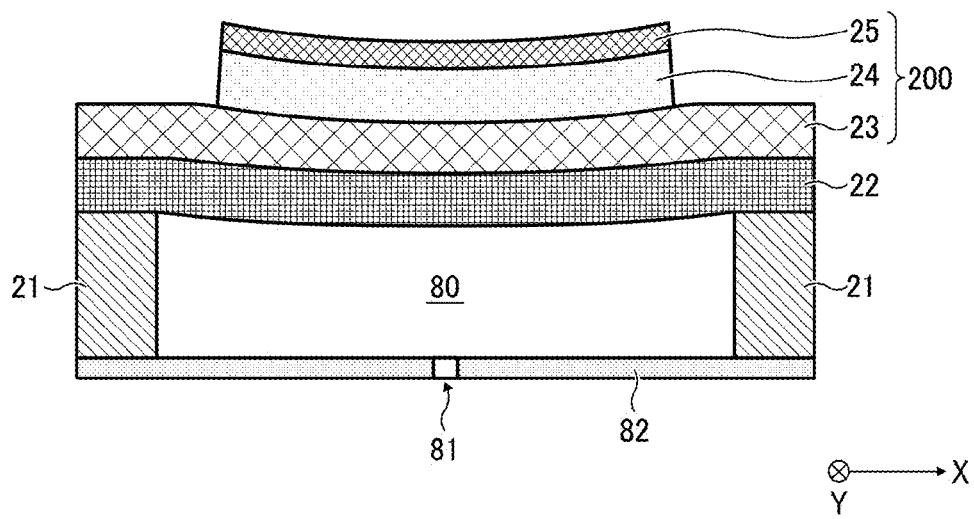
FIG. 12 is a cross-sectional view of the liquid discharge head.

When the through-hole part (pressure chamber 80) is formed in the substrate 21, because the substrate 21 does not constrain the diaphragm 22 and the piezoelectric element 200, the diaphragm 22 and the piezoelectric element 200 deform as illustrated in FIG. 12. The diaphragm 22 acts as base of the piezoelectric element 200 in FIG. 12 and deforms together with the piezoelectric element 200. At this time, the deformation of the piezoelectric element 200 in the direction parallel to the direction of the first length Lx (X-direction) is greater than the deformation of the piezoelectric element 200 in the direction parallel to the direction of the second length Ly (Y-direction).

A basic internal stress in the piezoelectric film 24 in the direction parallel to the direction of the first length Lx (X-direction) is greater than the basic internal stress in the piezoelectric film 24 in the direction parallel to the direction of the second length Ly (Y-direction). Therefore, a distribution condition of the basic internal stress of the piezoelectric film 24 is biased. This biased basic internal stress contributes to an increase of the amount of deformation of the piezoelectric film 24 when a predetermined drive voltage is applied between the lower electrode 23 and the upper electrode 25 that sandwich piezoelectric film 24.

Further, since the substrate 21 does not constrain the piezoelectric film 24, the piezoelectric film 24 more easily deforms in the direction parallel to the direction of the first length Lx (X-direction) than the direction parallel to the direction of the second length Ly (Y-direction). Thus, the number of the crystal structure having a rectangular shape increased in the piezoelectric film 24. The crystal structure in the piezoelectric film 24 has a rectangular shape that is elongated in one direction like C-domain. Therefore, the domain ratio S1y becomes smaller than the domain ratio S1x (S1y<S1x). Contribution of the rotation strain in deformation decreases with the increase in the amount of deformation of a piezoelectric strain, and thereby degree of degradation of the deformation (amount of surface displacement) in continuous driving over time decreases.

Figure 13:
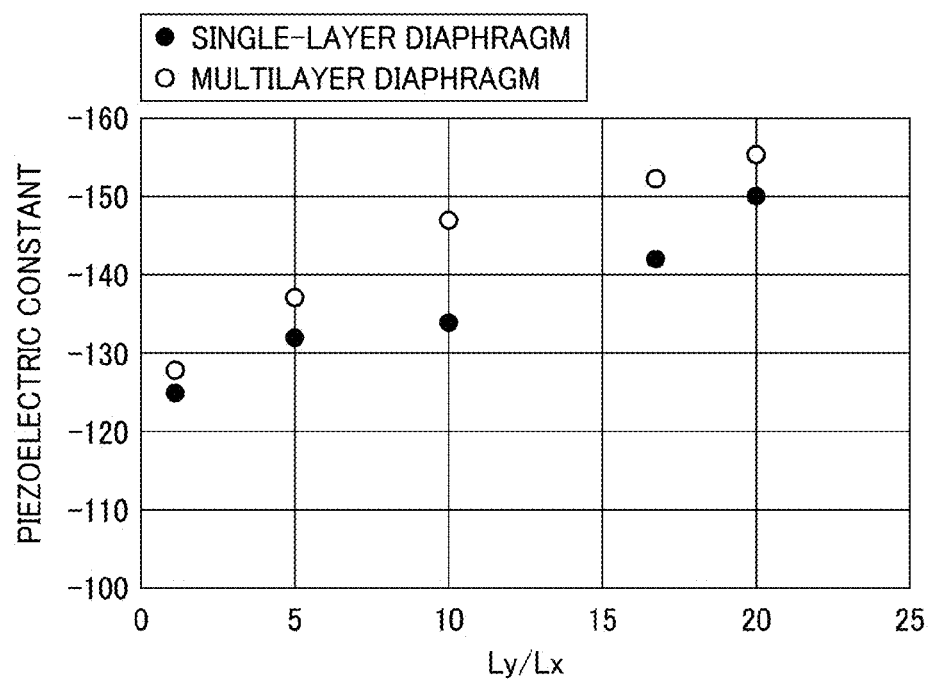
FIG. 13 is a graph of a relationship between a ratio of Ly/Lx and a piezoelectric constant.
Figure 14:
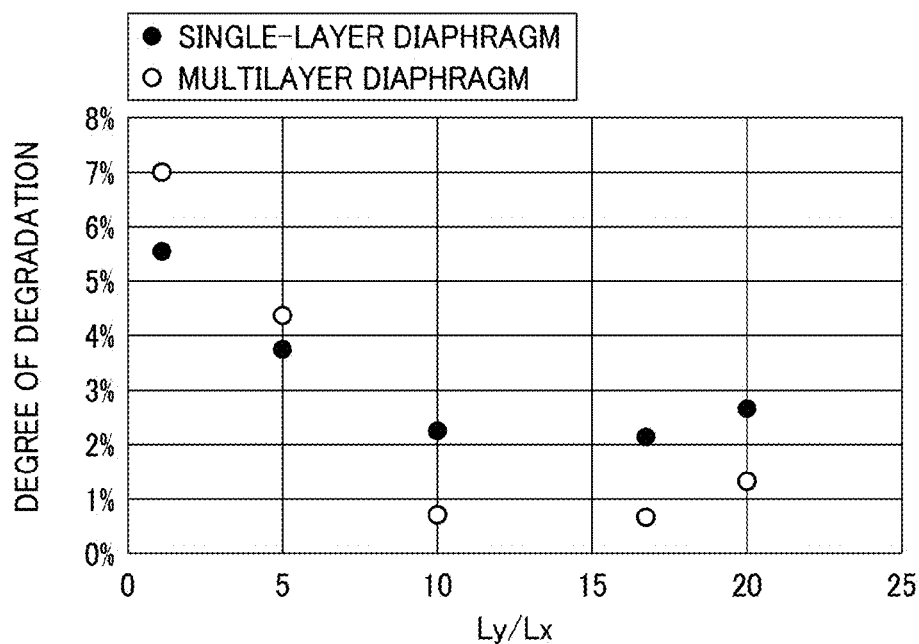
FIG. 14 is a graph of a relationship between the ratio of Ly/Lx and a degree of degradation of a deformation characteristic.

FIG. 13 is a graph of a relationship between the ratio of Ly/Lx and the piezoelectric constant. FIG. 14 is a graph of a relationship between the ratio of Ly/Lx and a degree of degradation of a deformation characteristic. The degree of degradation of the deformation characteristic is a percentage of amount of the deformation (amount of surface displacement) of the piezoelectric film 24 over time in continuous driving in the amount of deformation (amount of surface displacement) of the piezoelectric film 24 at initial condition (a state before continuous driving). Ly/Lx is a ratio of the second length Ly to the first length Lx (X-direction).

Black circles in FIGS. 13 and 14 represent the piezoelectric element 200 that is formed (disposed) on the diaphragm 22 formed by one layer of $SiO_2$. White circles in FIGS. 13 and 14 represent the piezoelectric element 200 that is formed (disposed) on the diaphragm 22 formed by multi-layer of $SiO_2$ layer and Si layer. The manufacturing condition of the diaphragm 22 farmed by multi-layer is described below.

As illustrated in FIGS. 13 and 14, when the ratio of Lx/Ly is one, the piezoelectric constant is small, and the degree of degradation of the deformation characteristic is large. The ratio of Lx/Ly is one when the shape of the pressure chamber 80 is circle or square such that the length Lx (X-direction) and the length. Ly (Y-direction) are identical.

The multi-layer diaphragm 22 obtains the result as illustrated by the white circles in FIGS. 13 and 14. The multi-layer diaphragm 22 has a configuration adjusted such that an overall film stress of the diaphragm 22 is compressive.

As illustrated in FIGS. 13 and 14, the configuration using multi-layer diaphragm 22 has a larger piezoelectric constant and a smaller degree of degradation of the deformation characteristic than the configuration using one-layer diaphragm 22. However, even using the multi-layer diaphragm 22, the piezoelectric constant decreases, and the degree of degradation of the deformation characteristic increases as the ratio of Ly/Lx approaches one, as similar to the configuration using one-layer diaphragm 22.

Figure 15:
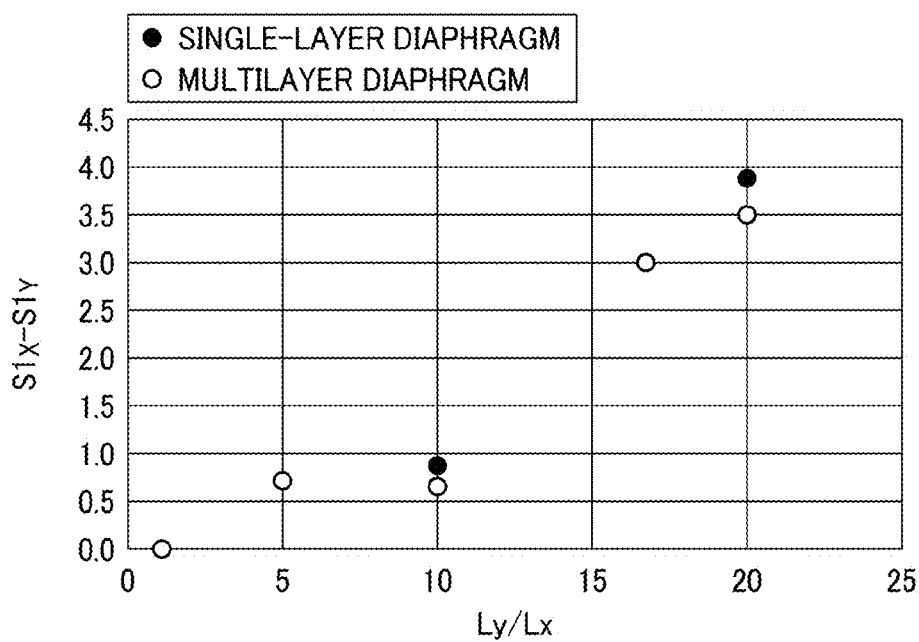
FIG. 15 is a graph of a relationship between the ratio of Ly/Lx and S1-S1y.

FIG. 15 is a graph of a relationship between the ratio of Ly/Lx and S1x-S1y.

As illustrated in FIG. 15, as the ratio Lx/Ly approaches one, the value S1x-S1y approaches zero in both cases of the diaphragm 22 formed with one-layer of $SiO_2$ (black circle) and the diaphragm 22 formed with multi-layer having a compressive structure (white circle).

Thus, as the value of S1x-S1y increases, the piezoelectric constant increases and the degree of degradation of the deformation characteristic decreases as illustrated in FIGS. 13 and 14. The value of S1x-S1y increases when the ratio of the c-domain in the direction parallel to the direction of the first length Lx (X-direction) is greater than the c-domain in the direction parallel to the direction of the second length Ly (Y-direction).

In the present embodiment, the first length Lx in the X-direction of the pressure chamber 80 is preferably in the range of not less than 50 μm and not greater than 70 μm, and more preferably in the range of not less than 55 μm and not greater than 65 μm. When the first length Lx is greater than the above-described value, a residual vibration becomes large. Thus, it becomes difficult to secure discharging performance at a high frequency. When the first length Lx is less than the above-described value, an amount of deformation is decreased, and it is difficult to secure a sufficient discharge voltage.

The ratio of Ly/Lx is preferably not less than 10 and more preferably not less than 15. When the ratio of Ly/Lx is smaller than the above-described value, the piezoelectric constant becomes slightly small.

In the present embodiment, the domain ratio S1x=Scx/(Sax+Scx) is preferably not greater than 20% and more preferably not greater than 18%. Further, the domain ratio S2x=Scx/(Sax+Scx+Sbx) is preferably not greater than 18% and more preferably not greater than 15%. When the domain ratio S1x and S2x is greater than the above-described value, cracks are likely to occur in the above-described step of polarization processing, thus hampering polarization processing under a condition of strong electric field. Accordingly, the degree of degradation of the amount of deformation (the amount of surface displacement) in continuous driving increases over time.

Figure 16A:
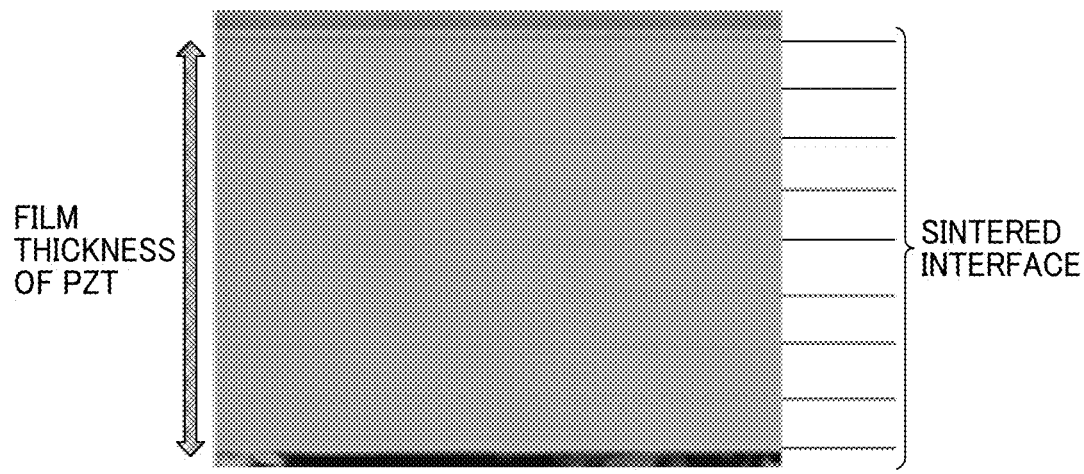
FIG. 16A is a cross-sectional view of an example of a sintered interface of the piezoelectric film according to an embodiment of the present disclosure.
Figure 16B:
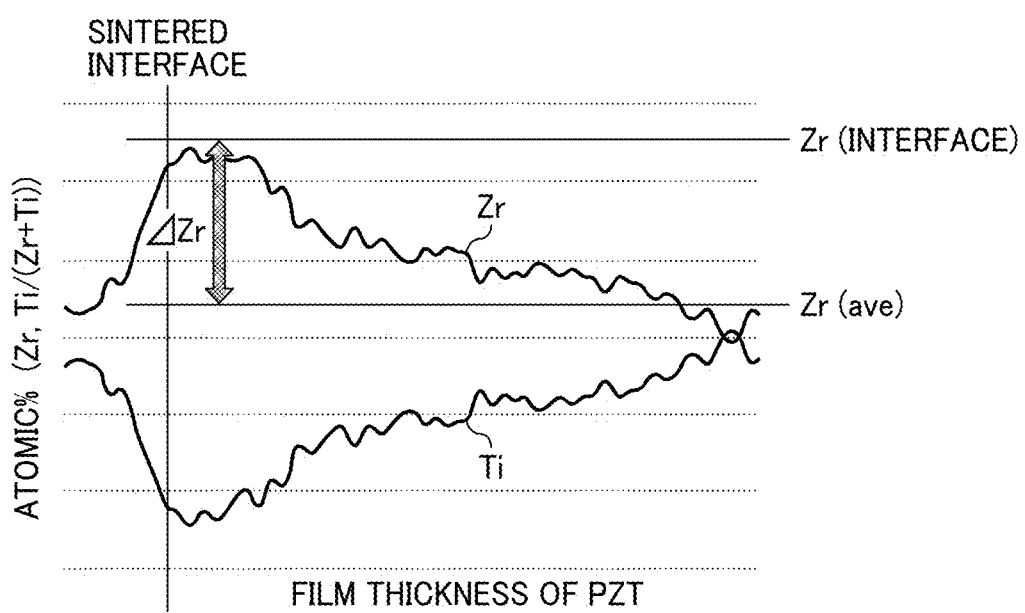
FIG. 16B is a graph of an example of the variation ratio of Zr of the sintered interface.

FIGS. 16A and 16B are illustrations of variation ratio of Zr of a sintered interface of the piezoelectric film 24 according to this embodiment (hereinafter, "lamination interface"). FIG. 16A is a cross-sectional view of an example of the sintered interface of the piezoelectric film 24. FIG. 16B is a graph of the variation ratio of Zr of the sintered interface.

The ratio of the tetragonal a-domain structure and the tetragonal c-domain structure affects the above-described composition ratio of Zr/Ti and is also affected by the amount of segregation of Zr generated in the sintered interface of the piezoelectric film 24 as illustrated in FIGS. 16A and 16B. In this embodiment, when film formation of the piezoelectric film 24 is performed from a solution process, a precursor-film creation step to create a PZT precursor film and a sintering step for crystallization are repeated to obtain a predetermined film thickness. At this time, a tendency of segregation of Zr is observed in a composition profile near the sintered interface crystalized. The proportion of the tetragonal a-domain structure and the tetragonal c-domain structure changes with the amount of segregation.

As the definition of the amount of segregation of Zr, Zr(ave) represents Zr/(Zr+Ti), which is an average atomic weight ratio of Zr entirely contained in the piezoelectric film 24 formed in a predetermined thickness. In addition, Zr(interface) represents Zr/(Zr+Ti), which is an atomic weight ratio of Zr at a lamination interface of the above-described plurality of thin films that forms the piezoelectric film 24. Where AZr represents the variation ratio of Zr at the lamination interface, the value of AZr=Zr(interface)-Zr(ave) may be not greater than 20% or may be not greater than 10%. If the variation ratio AZr is greater than the above-described range, cracks are likely to occur in the above-described step of polarization processing, thus hampering polarization processing under a condition of strong electric field. Accordingly, the amount of deformation (the amount of surface displacement) in continuous driving is likely to degrade over time.

Next, a description is given of a preferential orientation of the piezoelectric film 24 according to this embodiment and the degree of orientation (orientation rate) thereof. Here, the term "{100} preferentially oriented" indicates that {100} plane of a piezoelectric film 24 is more preferentially oriented than any other plane. The term "{111} preferentially oriented" indicates that {111} plane of a piezoelectric film 24 is more preferentially oriented than any other plane.

Figure 17:
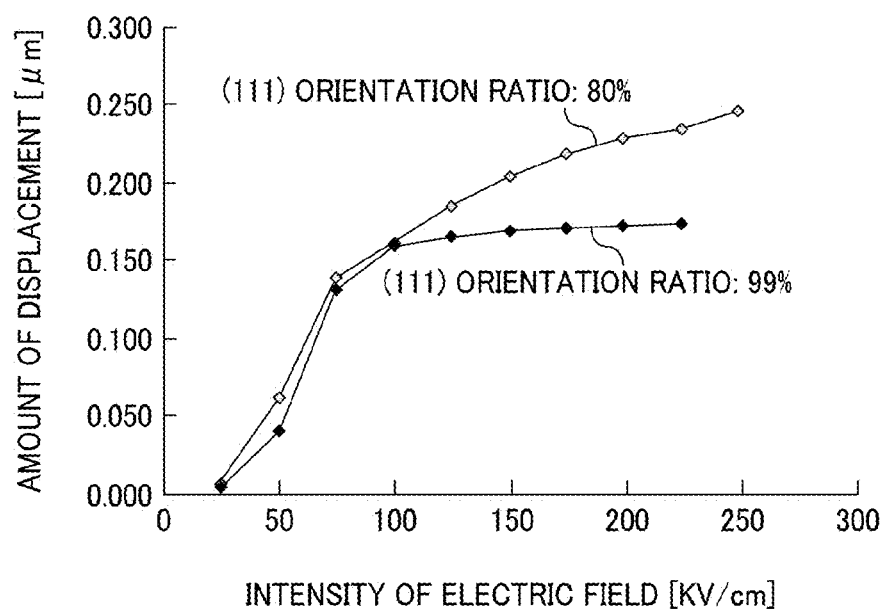
FIG. 17 is a graph of an example of results of an experiment conducted on the relationship between an intensity of an electric field and the amount of deformation (amount of surface displacement)

FIG. 17 is a graph of an example of results of an experiment conducted on the relationship between the intensity of electric field and the amount of displacement in two types of {111} orientation degrees differing from each other, in a {111} preferentially-oriented piezoelectric film 24.

Figure 18:
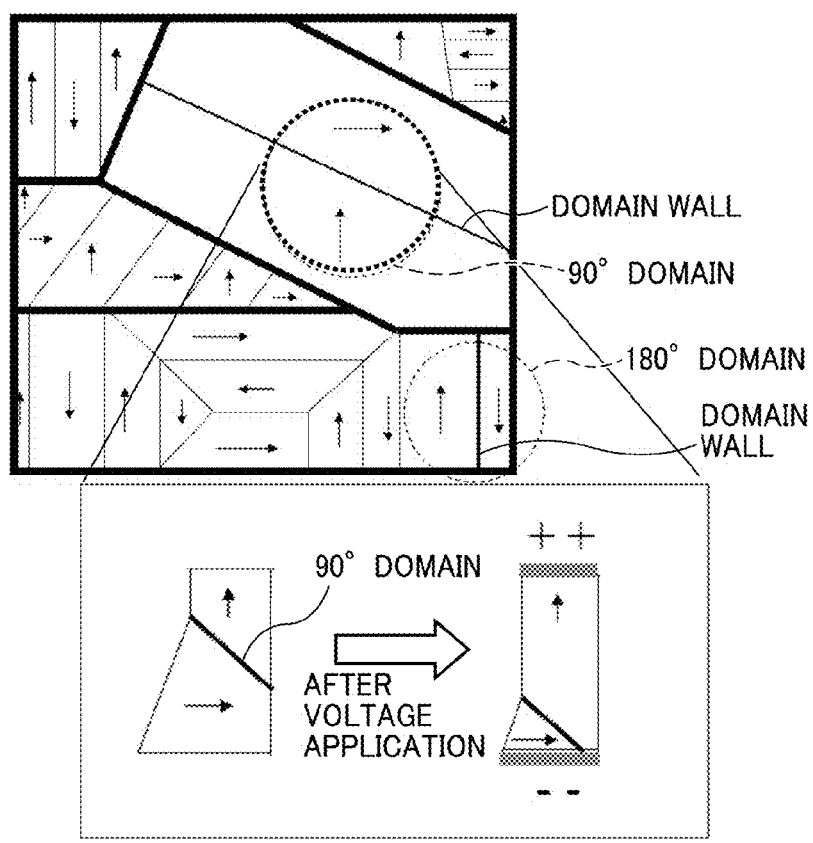
FIG. 18 is an illustration of an example of domains of a piezoelectric film and a change of the domains in application of voltage.

FIG. 18 is an illustration of an example of domains of the piezoelectric film 24 and a change of the domains in application of voltage.

As illustrated in a graph of the {111} orientation degree of 99% in FIG. 17, when the {111} orientation degree is extremely high (for example, 95% or greater), the amount of displacement relative to the intensity of electric field of the piezoelectric film 24 saturates in the middle. Therefore, it was found that a sufficient amount of deformation (amount of surface displacement) was not obtained under high electric field intensities. The inventors think that such experiment results are caused by the following mechanism.

As illustrated in FIG. 18, the deformation (surface displacement) of the piezoelectric film 24 is obtained by (1) an increase of displacement due to piezoelectric strain and (2) an increase of strain due to domain rotation when voltage is applied. At this time, in a case in which {111} plane of PZT is completely oriented, since the displacement is obtained by only (1) an increase of displacement due to piezoelectric strain with little influence of (2) domain rotation, it seems that the amount of deformation (amount of surface displacement) saturates in the middle.

Here, the term "piezoelectric strain" represents a strain generated by a piezoelectric effect represented by a piezoelectric constant, such as d31, of a piezoelectric body, such as PZT. The term "domain rotation" used herein indicates that, when voltage is applied to a piezoelectric body, such as PZT, the crystal structure of domains in the piezoelectric body changes as if the domains rotate. For example, the c-domain of the piezoelectric body, such as PZT, turns into the a-domain or the a-domain turns into the a-domain, so that the crystal structure of domains changes as if the domains rotate 90 degrees.

From the above-described results, in the piezoelectric film 24 according to this embodiment, {100} plane is preferentially oriented. As described above, the orientation degree $\rho\{hkl\}$ of $\{hkl\}$ plane is expressed by the following formula (1):

$$\rho\{hkl\}=I\{hkl\}/\Sigma I\{hkl\} \qquad (1)$$

Note that $\rho\{hkl\}$ represents the degree of orientation of $\{hkl\}$ plane orientation, I $\{hkl\}$ represents the peak intensity of a given orientation, and $\{hkl\}$ represents a total sum of each peak intensities.

In the above-described formula (1), the total sum of each peak intensities obtained by the θ-2θ scanning measurement of the X-ray diffraction (XRD) method is 1. The piezoelectric film 24 according to this embodiment is a polycrystalline film in which a sum of the orientation degree $\rho\{110\}$ of $\{110\}$ orientation and the orientation degree $\rho\{111\}$ of $\{111\}$ orientation, which are calculated based on the ratio of peak intensities of the respective orientations, is within a predetermined range. For example, the sum of the orientation degree $\rho\{110\}$ and the orientation degree $\rho\{111\}$ of the piezoelectric film 24 according to this embodiment is not less than 0.0002 and not greater than 0.25.

In addition, the sum of the orientation degree of $\{110\}$ orientation and the orientation degree of $\{111\}$ orientation may be not less than 0.001 and not greater than 0.10. If the sum is smaller than the above-described ranges and, for example, the sum of the orientation degree of $\{110\}$ orientation and the orientation degree of $\{111\}$ orientation is close to zero in, e.g., an epitaxial single crystal film or a uniaxial orientation film, a crack is likely to occur in the step of polarization processing, thus hampering polarization processing under strong electric field conditions.

Accordingly, the amount of deformation (amount of surface displacement) is more likely to degrade over time in continuous driving. By contrast, if the sum of the orientation degree of {110} orientation and the orientation degree of {111} orientation is greater than the above-described ranges, a sufficient piezoelectric strain is not obtained and a sufficient amount of deformation (amount of surface displacement) is not reliably obtained.

As described above, the piezoelectric element 200 according to this embodiment is a {100} preferentially-oriented polycrystalline film in which the orientation degree of {110} orientation and the orientation degree of {111} orientation are slightly mixed in the crystal orientation of the piezoelectric film 24.

The pressure chamber 80 has the first length Lx in the X-direction and the second length Ly that is longer than the first length Lx in the Y-direction perpendicular to the X-direction. A plurality of diffraction peak areas is obtained by a peak separation process of diffraction peaks derived from {200} plane or {400} plane obtained by the θ-2θ measurement of the piezoelectric film 24 according to the X-ray diffraction method. Two diffraction peak areas Sa and Sc are attributed to a tetragonal a-domain structure and a tetragonal c-domain structure, respectively. The first domain ratio of S1x=Sc/(Sa+Sc), which is measured such that an incident surface of X-ray in the θ-2θ measurement is parallel to the direction of the first length Lx (X-direction), is different from the second domain ratio of S1y=Sc/(Sa+Sc), which is measured such that an incident surface of X-ray in the θ-2θ measurement is parallel to the direction of the second length Ly (Y-direction).

The piezoelectric element 200 of the present embodiment thereby can secure a sufficient amount of deformation (amount of surface displacement) to preferably maintain ink discharge properties and sufficiently suppress degradation of the amount of deformation (the amount of surface displacement) even after continuous discharge, thus allowing the liquid discharge apparatus 500 to perform stable ink discharge when the piezoelectric element 200 is applied to a liquid discharge apparatus 500 such as an inkjet recording apparatus (image forming apparatus) as described below.

In the above-described step of polarization processing, for example, when electric discharge is performed with the above-described polarization processing device 40 illustrated in FIG. 4, no cracks occurs in the piezoelectric film 24. Accordingly, polarization processing is reliably performed on, for example, a plurality of piezoelectric elements 200 disposed in a liquid discharge head 104 without cracks, thus enhancing the yield.

Figure 19:
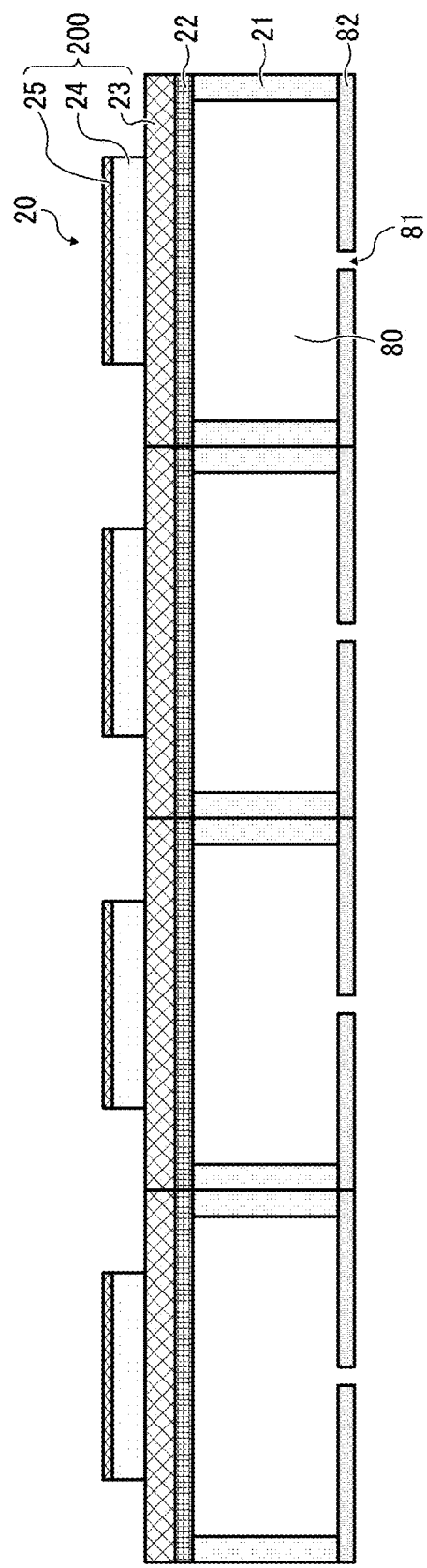
FIG. 19 is a cross-sectional view of a liquid discharge head according to an embodiment of the present disclosure.

FIG. 19 is a cross-sectional view of an example of a schematic configuration of a liquid discharge head 104 according to this embodiment.

As illustrated in FIG. 19, the liquid discharge head 104 according to this embodiment includes nozzles 81 to discharge droplets, a pressure chambers 80 communicated with the nozzles 81, and a discharge drive units to increase the pressure of liquid in the pressure chambers 80. Each of the discharge drive units includes a diaphragm 22 that forms a part of a wall of the pressure chamber 80 and the above-described piezoelectric element 200 disposed on the diaphragm 22.

In the liquid discharge head 104 according to this embodiment, the pressure chamber 80 is disposed in the substrate 21. A nozzle plate 82 including the nozzles 81 from which the liquid is discharged. The nozzle plate 82 is disposed at a lower end of the pressure chamber 80. When voltage is applied to the piezoelectric element 200 and displaces the piezoelectric film 24, the diaphragm 22 is deformed (the surface of the diaphragm 22 is displaced) to discharge liquid of the pressure chamber 80 from the nozzles 81.

As illustrated in FIG. 19, a plurality of the piezoelectric elements 200 may be disposed in the liquid discharge head 104. The liquid discharge head 104 may include, for example, a liquid supply unit to supply liquid, such as ink, to the pressure chamber 80 and a channel through which liquid flows. In a configuration in which the liquid discharge head 104 includes the channel, the fluid resistance of the channel against the liquid may be considered.

The liquid discharge head 104 includes the above-described piezoelectric element 200. Accordingly, the piezoelectric element 200 can secure a sufficient amount of deformation (amount of surface displacement) to preferably maintain ink discharge properties and sufficiently suppress degradation of the amount of deformation (the amount of surface displacement) even after continuous discharge, thus allowing the liquid discharge head 104 to perform stable droplet discharge.

Next, examples of the piezoelectric element 200 according to this embodiment are described with Examples and Comparative Examples. Note that the examples of the piezoelectric element 200 are not limited to the following examples.

EXAMPLE 1

In Example 1, a thermal oxide film ($SiO_2$, having a film thickness of 1 μm) was formed on a 6-inch silicon wafer as a substrate 21 and a diaphragm 22. The thermal oxide film becomes the substrate 21 and the diaphragm 22. Then, a lower electrode 23 was formed on a part of the diaphragm 22. The lower electrode 23 has a structure in which an adhesion layer and a metal electrode film are laminated one on the other.

A titanium film (having a film thickness of 20 nm) was formed at a film formation temperature of 350° C. by a sputtering apparatus and thermal oxidization was performed on the titanium film at 750° C. by rapid thermal annealing (RTA) treatment. Thus, the adhesion layer was formed. Subsequently, as the metal electrode film, a platinum film (having a film thickness of 160 nm) was formed at a film formation temperature of 400° C. by the sputtering apparatus.

Next, a solution (hereinafter, PT solution) prepared in a ratio of amount of substance of Pb:Ti=1:1 as a $PbTiO_3$ layer (hereinafter, PT layer) being a base layer and a PZT precursor solution prepared in a ratio of amount of substance of Pb:Zr:Ti=115:49:51 as a piezoelectric film 24 were prepared, and were formed as a film by a spin coating method.

For synthesis of a specific precursor coating liquid, lead acetate trihydrate, titanium isopropoxide, and zirconium isopropoxide were used as starting materials. Crystal water of lead acetate was dissolved in methoxyethanol and was then dehydrated. The amount of lead is excessively large for a stoichiometric composition. This is to prevent reduction in crystallinity by so-called lead missing during heat treatment. The titanium isopropoxide and the zirconium isopropoxide were dissolved in methoxyethanol, an alcohol exchange reaction and an esterification reaction were advanced, a resultant was mixed with a methoxyethanol solution having dissolved the lead acetate, and the PZT precursor solution was synthesized. A concentration of the PZT in the PZT precursor solution was 0.5 [mol/l]. The PT solution was prepared in the same manner as the PZT precursor solution.

Next, first, using the PT solution, the PT layer was formed by spin coating and drying was performed at 120° C. Then, a film was formed by spin coating method using the PZT precursor solution, and 120° C. dry and 400° C. thermal decomposition were performed on the film. Then, the steps of film formation, drying, and thermal decomposition were repeated to form a lamination film. After a thermal decomposition process was executed on a third layer, crystallization heat treatment (temperature of 730° C.) was executed by rapid thermal annealing (RTA). At this time, a film thickness of the PZT was 240 nm. The steps were repeated eight times. In other words, a total of 24 layers were laminated, and a piezoelectric film 24 having a film thickness of about 2 µm was obtained.

Next, an upper electrode 25 was formed. A $SrRuO_3$ film (having a film thickness of 40 nm) was formed as an oxide electrode film. Further, a platinum (Pt) film (having a film thickness of 125 mm) was formed as a metal electrode film by sputtering. Then, a film was formed by the spin coating method using a photoresist (TSMR8800) manufactured by TOKYO OHKA KOGYO., LTD, a resist pattern was formed by a normal photolithographic method, and a pattern illustrated in FIGS. 3A and 3B was manufactured using an inductively coupled plasma (ICP) etching device (manufactured by SAMCO INC.).

Next, an $Al_2O_3$ film having a film thickness of 50 nm was formed as a first insulating protective film 31, using an atomic layer deposition (ALD) method. At this time, Al of trimethylaluminum (TMA: manufactured by Sigma-Aldrich Co. LLC.) and $O_3$ generated by an ozone generator are alternately supplied as raw materials, and laminated for film formation.

Next, as illustrated in FIGS. 3A and 3B, a contact-hole 32 was formed by etching. Next, as a connector 35 between a discrete electrode and a discrete electrode pad 34, an inter-pad connector 37 between a common electrode and a common electrode pad 36, a discrete electrode pad 34, and a common electrode pad 36, a film of Al was formed by sputtering and patterned by etching.

Next, as a second insulating protective film 38, a film of $Si_3N_4$ was formed at a film thickness of 500 nm by a plasma chemical vapor deposition (CVD) method. Then, openings are formed at positions of the discrete electrode pad 34 and the common electrode pad 36, and thus the piezoelectric element 200 was produced.

Then, with the polarization processing device 40 illustrated in FIG. 4, polarization processing was performed on the piezoelectric element 200 by corona charging. A tungsten wire of φ50 µm was used as a corona electrode used for corona charging. Polarization processing conditions were a processing temperature of 80° C., a corona voltage of 9 kV, a grid voltage of 1.5 kV, a processing time of 30 seconds, a distance between the corona electrode and the grid electrode to be 4 mm, and a distance between the grid electrode and a stage to be 4 mm.

Then, the through-hole part that becomes the pressure chamber 80 is formed in the back face of the substrate 21 as illustrated in FIG. 10. Then, the nozzle plate 82, on which the nozzles 81 are formed, is bonded to the back face of the substrate 21 to manufacture the liquid discharge head 104 as illustrated in FIG. 12. The pressure chamber 80 of the liquid discharge head 104 of the first embodiment has a first length Lx of 60 µm in X-direction and has a second length Ly of 1000 µm in Y-direction perpendicular to the X-direction.

EXAMPLE 2

The liquid discharge head 104 of Example 2 was manufactured. The liquid discharge head 104 of Example 2 was similar to Example 1 except that the pressure chamber 80 had a first length Lx of 70 µm in X-direction and had a second length Ly of 700 µm in Y-direction.

EXAMPLE 3

The liquid discharge head 104 of Example 3 was manufactured. The liquid discharge head 104 of Example 3 was similar to Example 1 except that the pressure chamber 80 had a first length Lx of 50 µm in X-direction and had a second length Ly of 1000 µm in Y-direction.

EXAMPLE 4

The liquid discharge head 104 of Example 4 was manufactured. The liquid discharge head 104 of Example 4 was similar to Example 1 except that the pressure chamber 80 had a first length Lx of 100 µm in X-direction and had a second length Ly of 500 µm in Y-direction.

EXAMPLE 5

The liquid discharge head 104 of Example 5 is manufactured. The liquid discharge head 104 of Example 5 is similar to Example 1 except that the diaphragm 22 is formed in the order of $SiO_2$ (film thickness 600 nm), Si (film thickness 200 nm), $SiO_2$ (film thickness 730 nm), Si (film thickness 200 nm), and $SiO_2$ (film thickness 600 nm) on a 6-inch silicon wafer.

EXAMPLE 6

The liquid discharge head 104 of Example 6 was manufactured. The liquid discharge head 104 of Example 6 was similar to Example 1 except that the diaphragm 22 was formed in the order of $SiO_2$ (film thickness 600 µm), Si (film thickness 200 nm), $SiO_2$ (film thickness 730 nm), Si (film thickness 200 nm), and $SiO_2$ (film thickness 600 nm) on a 6-inch silicon wafer. Further, the liquid discharge head 104 of Example 6 was similar to Example 1 except that the pressure chamber 80 had a first length Lx of 70 µm in X-direction and had a second length Ly of 700 µm in Y-direction.

EXAMPLE 7

The liquid discharge head 104 of Example 7 was manufactured. The liquid discharge head 104 of Example 7 was similar to Example 1 except that the diaphragm 22 was formed in the order of $SiO_2$ (film thickness 600 µm), Si (film thickness 200 nm), $SiO_2$ (film thickness 730 nm), Si (film thickness 200 nm), and $SiO_2$ (film thickness 600 nm) on a 6-inch silicon wafer. The liquid discharge head 104 of Example 7 was similar to Example 1 except that the pressure chamber 80 had a first length Lx of 50 µm in X-direction and had a second length Ly of 1000 µm in Y-direction.

EXAMPLE 8

The liquid discharge head 104 of Example 8 was manufactured. The liquid discharge head 104 of Example 8 was similar to Example 1 except that the diaphragm 22 was formed in the order of $SiO_2$ (film thickness 600 μm), Si (film thickness 200 nm), $SiO_2$ (film thickness 730 nm), Si (film thickness 200 nm), and $SiO_2$ (film thickness 600 nm) on a 6-inch silicon wafer. Further, the liquid discharge head 104 of Example 8 was similar to Example 1 except that the pressure chamber 80 had a first length Lx of 100 μm in X-direction and had a second length Ly of 500 μm in Y-direction.

COMPARATIVE EXAMPLE 1

The liquid discharge head 104 of Comparative Example 1 was manufactured. The liquid discharge head 104 of Comparative Example 1 was similar to Example 1 except that the pressure chamber 80 had a first length Lx of 200 μm in X-direction and had a second length Ly of 200 μm in Y-direction.

COMPARATIVE EXAMPLE 2

The liquid discharge head 104 of Comparative Example 2 was manufactured. The liquid discharge head 104 of Comparative Example 2 was similar to Example 1 except that the diaphragm 22 was formed in the order of $SiO_2$ (film thickness 600 μm), Si (film thickness 200 nm), $SiO_2$ (film thickness 730 nm), Si (film thickness 200 nm), and $SiO_2$ (film thickness 600 nm) on a 6-inch silicon wafer. The liquid discharge head 104 of Comparative Example 2 was similar to Example 1 except that the pressure chamber 80 had a first length Lx of 200 μm in X-direction and had a second length Ly of 200 μm in Y-direction.

With the piezoelectric film 24 of the liquid discharge head 104 produced in the above-described Examples 1 to 8 and Comparative Examples 1 and 2, crystallinity was evaluated by the θ-2θ measurement according to an X-ray diffraction (XRD) method after pressure chamber 80 was formed in the substrate 21 (the state in which the piezoelectric film 24 is not constrain by the substrate 21 ) as illustrated in FIG. 12. An XRD apparatus used in the measurement was X'Pert-MRD (manufactured by Phillips). The X-ray source was CuKα and the wavelength of X-ray was 1.541 Å (0.1541 nm). Slit ¼ and Mask 15 were used.

Electric properties and deformation (surface displacement) properties (piezoelectric constant) were evaluated on each of the liquid discharge heads 104 manufactured at above-described Examples 1 to 8 and Comparative Examples 1 and 2. In the evaluation of deformation (surface displacement) properties, the evaluation of vibration was performed after the substrate 21 was processed to form the pressure chamber 80 on the substrate 21.

For example, when a drive voltage of a predetermined pulse waveform (a triangular waveform of 1 kHz) to form an electric field of 150 kV/cm is applied on the piezoelectric element 200, the amount of deformation of the lower surface of the diaphragm 22 is measured with a laser Doppler vibrometer. Then, the value of piezoelectric constant d31 was calculated through matching with simulation results. After initial properties were evaluated, durability properties (properties immediately after the drive voltage having the above-described predetermined pulse waveform was repetitively applied $1\times10^{10}$ times) were evaluated.

Evaluation results of Examples 1 to 8 and Comparative Examples 1 and 2 are illustrated in following Table 1 with the ratio Ly/Lx of the first length Lx (X-direction) and the second length Ly (Y-direction), the domain ratio S1y and S2y in Y-direction, and the domain ratio S1x and S2x in X-direction. Examples 1 to 8 are referred to "EX 1" to "EX 8", respectively in Table 1. Comparative Examples 1 and 2 are referred to "CE 1" and "CE 2" in Table 1, respectively.

TABLE 1

|  | Lx | Ly | Ly/Lx | S1y | S1x | S2y | S2x | d31 INITIAL | d31 AFTER | DISCHARGE EVALUATION |
|---|---|---|---|---|---|---|---|---|---|---|
| EX 1 | 60 | 1000 | 17 | 14.0 | 17.0 | 10.0 | 10.0 | −142 | −139 | GOOD |
| EX 2 | 70 | 700 | 10 | 14.3 | 15.2 | 9.7 | 11.0 | −134 | −131 | GOOD |
| EX 3 | 50 | 1000 | 20 | 14.2 | 18.1 | 10.1 | 14.1 | −150 | −146 | GOOD |
| EX 4 | 100 | 500 | 5 | 13.4 | 14.1 | 9.7 | 10.1 | −132 | −127 | ACCEPTABLE |
| EX 5 | 60 | 1000 | 17 | 15.1 | 18.1 | 11.0 | 14.1 | −152 | −151 | VERY GOOD |
| EX 6 | 70 | 700 | 10 | 15.3 | 16.0 | 10.9 | 12.0 | −147 | −146 | VERY GOOD |
| EX 7 | 50 | 1000 | 20 | 15.1 | 18.6 | 11.2 | 14.5 | −155 | −153 | VERY GOOD |
| EX 8 | 100 | 500 | 5 | 14.2 | 14.9 | 10.3 | 11.0 | −137 | −131 | ACCEPTABLE |
| CE 1 | 200 | 200 | 1 | 13.2 | 13.2 | 9.3 | 9.3 | −125 | −118 | POOR |
| CE 2 | 200 | 200 | 1 | 13.5 | 13.5 | 9.5 | 9.5 | −128 | −199 | POOR |

A value of "decreasing rate of the piezoelectric constant= ((initial piezoelectric constant d31)−(piezoelectric constant d31 after the durability test))/(initial piezoelectric constant d31)" is calculated to evaluate the degree of degradation of deformation (surface displacement) properties of the piezoelectric element 200 after continuously driving the piezoelectric element 200.

The decreasing rate of the piezoelectric constant is calculated for Example 1. It is (142-139)/142=0.021. Similarly, the decreasing rate of the piezoelectric constant for Example 2, Example 3, Example 4, Example 5, Example 6, Example 7, Example 8, Comparative Example 1, and Comparative Example 2 are 0.02, 0.027, 0.038, 0.006, 0.006, 0.013, 0.044, 0.056, and 0.070, respectively.

Criteria for evaluating the discharge property in Table 1 is described below.

Very Good: the piezoelectric element 200 having the piezoelectric constant after the durability test of not less than −145 pm/V and the decreasing ratio of the electric constant of less than 0.02.

Good: the piezoelectric element 200 having the piezoelectric constant after the durability test of not less than −130 pm/V and the decreasing ratio of the electric constant of less than 0.03, and does not satisfy the standard of "Very Good" as described above.

Acceptable: the piezoelectric element 200 having the piezoelectric constant after the durability test of not less than −120 pm/V and the decreasing ratio of the electric constant of less than 0.05, and does not satisfy the standard of either "Very Good" and "Good" as described above.

Poor: the piezoelectric element 200 having the piezoelectric constant after the durability test of less than −120 pm/V and the decreasing ratio of the electric constant of not less than 0.05.

From the test results of the initial properties and the deformation (surface displacement) properties after durability test, it was found that Examples 1 to 8 had the same properties as those of a typical ceramic sintered object. Converting into the value of piezoelectric constant d31, properties in the range of from −120 pm/V to −160 pm/V were obtained as initial properties and as properties after durability test. The initial properties and the properties after the durability test of the piezoelectric constant d31 of Comparative Examples 1 and 2 are inferior to that of Examples 1 to 8 described above. Especially, the properties after the durability test are lower than −120 pm/V.

Next, a description is given of the liquid discharge apparatus 500 including the liquid discharge head 104 according to an embodiment of the present disclosure.

Figure 20:
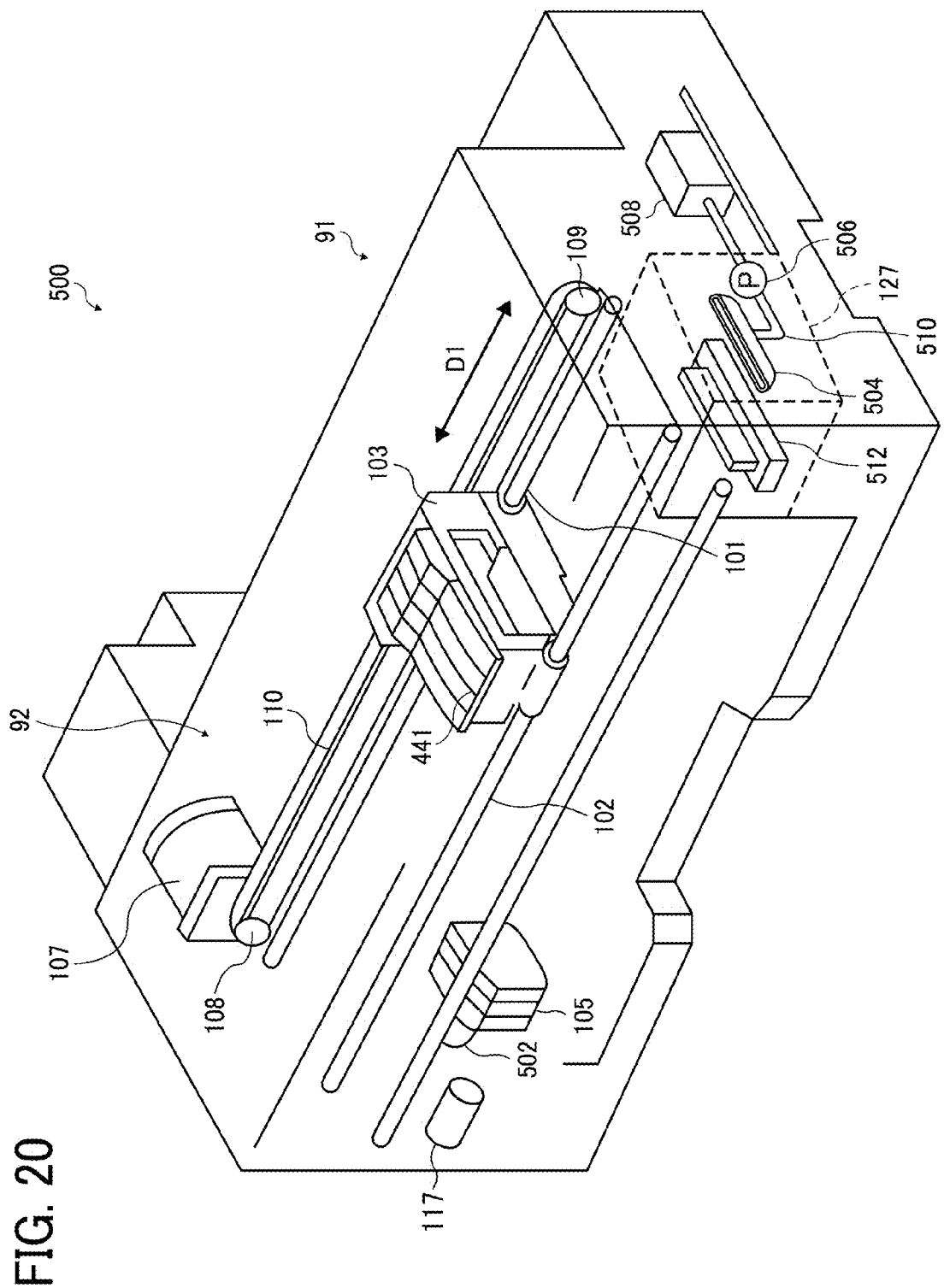
FIG. 20 is a perspective view of a liquid discharge apparatus according to an embodiment of the present disclosure.
Figure 21:
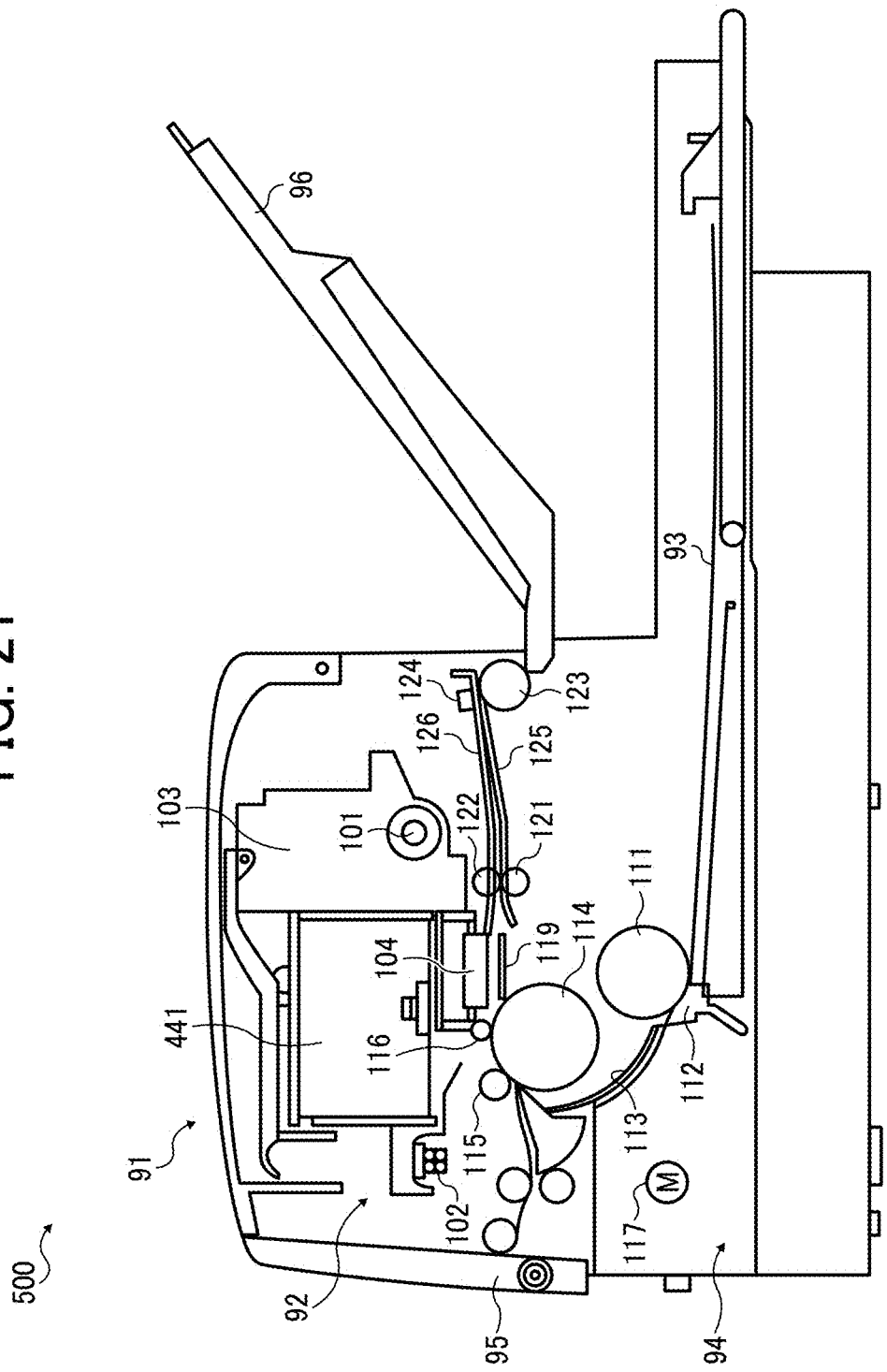
FIG. 21 is a side view of the liquid discharge apparatus of FIG. 20.

FIG. 20 is a perspective view of an example of a liquid discharge apparatus 500 according to an embodiment of the present disclosure. FIG. 21 is a side view of an example of a mechanical section of the liquid discharge apparatus 500 of FIG. 20. In FIGS. 20 and 21, an inkjet recording apparatus being an image forming apparatus is illustrated as an example of the liquid discharge apparatus 500.

The liquid discharge apparatus 500 according to this embodiment includes, e.g., a printing assembly 92 inside a recording apparatus body 91. The printing assembly 92 includes, e.g., a carriage 103, liquid discharge heads 104, and ink cartridges 105. The carriage 103 is movable in a main scanning direction indicated by arrow D1 in FIG. 20. The liquid discharge heads 104 and head-tanks 441 are mounted on the carriage 103. The ink cartridges 105 supply ink to the head-tanks 441 and liquid discharge heads 104 via supply tubes 502.

A sheet feeding cassette (or a sheet feeding tray) 94 is detachably mountable to a lower portion of the recording apparatus body 91. From the front side of the recording apparatus body 91, a plurality of sheets 93 can be stacked on the sheet feeding cassette 94. A bypass tray 95 is disposed at an angle to the recording apparatus body 91 to be openable so that a user can manually stack sheets 93 on the bypass tray 95. When a sheet 93 fed from the sheet feeding cassette 94 or the bypass tray 95 is taken in, the printing assembly 92 records a desired image on the sheet 93. Then, the sheet 93 is ejected to a sheet ejection tray 96 mounted on a back face side of the recording apparatus body 91.

Figure 23:
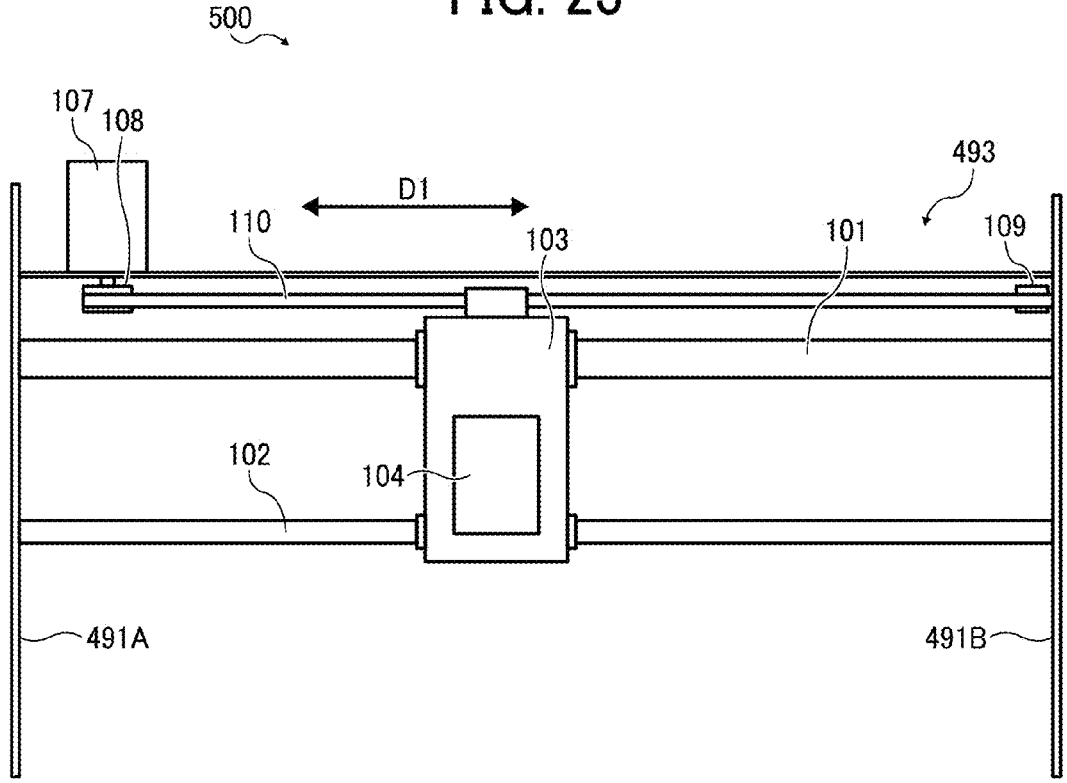
FIG. 23 is a plan view of a liquid discharge device.

In the printing assembly 92, a main-guide rod 101 and a sub-guide rod 102 support the carriage 103 slidably in the main scanning direction D1. The main-guide rod 101 and the sub-guide rod 102 act as guides of the carriage 103 and are laterally bridged between left and right side plates 491A and 491B as illustrated in FIG. 23. The carriage 103 mounts the liquid discharge heads 104 configured to discharge ink droplets of different colors of yellow (Y), cyan (C), magenta (M), and black (Bk) from the nozzles 81 of the liquid discharge heads 104. The nozzles 81 are arrayed in a direction perpendicular to the main scanning direction D1. The liquid discharge heads 104 are mounted on the carriage 103 such that ink discharge directions are oriented downward. The liquid discharge apparatus 500 is also detachably mount the ink cartridges 105 to supply different colors of ink to the head-tanks 441 and the liquid discharge heads 104.

Each of the ink cartridges 105 has an atmosphere communication port at an upper portion thereof to communicate with the atmosphere, a supply port at a lower portion thereof to supply ink to the liquid discharge heads 104, and a porous body inside to be filled with ink. Ink to be supplied to the liquid discharge heads 104 is maintained at a slightly negative pressure by capillary force of the porous body of each ink cartridge 105. In this example, the plurality of liquid discharge heads 104 is used in the liquid discharge apparatus 500. However, in some embodiments, a single liquid discharge head 104 having nozzles 81 to discharge different colors of ink droplets may be used as the liquid discharge head 104.

Note that a rear side of the carriage 103 (downstream in a sheet conveyance direction) is slidably fitted to the main-guide rod 101, and a front side of the carriage 103 (upstream in the sheet conveyance direction) is slidably fitted to the sub-guide rod 102. A timing belt 110 is stretched taut between a driving pulley 108, which is driven by a main scanning motor 107 to rotate, and a driven pulley 109, to move the carriage 103 for scanning in the main scanning direction D1. The timing belt 110 is secured to the carriage 103, and the carriage 103 is reciprocally moved by the forward and reverse rotation of the main scanning motor 107.

Next, a description is given of a conveyance assembly acting as a conveyor to convey a sheet 93, which is set in the sheet feeding cassette 94, to a position below the liquid discharge heads 104. The conveyance assembly includes a sheet feed roller 111 and a friction pad 112 to separate and feed the sheet 93 from the sheet feeding cassette 94, a guide 113 to guide the sheet 93, and a conveyance roller 114 to reverse and convey the sheet 93 fed from the sheet feeding cassette 94. The conveyance assembly further includes a conveyance roller 115 pressed against a circumferential surface of the conveyance roller 114 and a leading end roller 116 to define an angle at which the sheet 93 is fed from the conveyance roller 114. The conveyance roller 114 is driven for rotation by a sub-scanning motor 117 via a gear train.

The conveyance assembly further includes a print receiver 119 as a sheet guide to guide the sheet 93, which is fed from the conveyance roller 114, in accordance with a range of movement of the carriage 103 in the main scanning direction D1. The liquid discharge apparatus 500 further includes a conveyance roller 121 and a spur roller 122 downstream from the print receiver 119 in the sheet conveyance direction such that the conveyance roller 121 and the spur roller 122 are rotationally driven to convey the sheet 93 in a sheet ejection direction. The liquid discharge apparatus 500 further includes a sheet ejection roller 123 and a spur roller 124 to feed the sheet 93 to the sheet ejection tray 96, and guides 125 and 126 forming a sheet ejection path.

When the liquid discharge apparatus 500 performs recording, the liquid discharge apparatus 500 drives the liquid discharge heads 104 in accordance with image signals while moving the carriage 103, discharges ink onto the stopped sheet 93 to record one line on the sheet 93, feeds the sheet 93 by a predetermined amount, and then records a next line on the sheet 93. When the liquid discharge apparatus 500 receives a recording end signal or a signal indicating the arrival of a trailing end of the sheet 93 at a recording area, the liquid discharge apparatus 500 terminates a recording operation and ejects the sheet 93.

Further, the liquid discharge apparatus 500 further, includes a recovery device 127 to recover the liquid discharge heads 104 from a discharge failure. The recovery device 127 is disposed at non-recoding area that is located at a right end side of the liquid discharge apparatus 500 in the main scanning direction D1 in FIG. 20. The recovery device 127 includes a capping device 504, a suction device 506, and a cleaning device 512. During standby for printing, the carriage 103 is moved toward the recovery device 127 and the liquid discharge heads 104 are capped with the capping device 504. Thus, the nozzles 81 of the liquid discharge heads 104 are maintained in humid state, thus preventing discharge failure due to dry of ink. In addition, for example, during recording, ink not relating to the recording is discharged to the capping device 504 to maintain the viscosity of ink in the entire nozzles 81 constant, thus maintaining stable discharging performance.

When a discharge failure occurs, the nozzles 81 of the liquid discharge heads 104 are sealed by the capping device 504 and ink, and bubbles are sucked from the nozzles 81 by the suction device 506, such as a pump, through a tube 510. The cleaning device 512 removes ink and dusts adhered to a surface of the nozzle plate 82, thus recovering the discharge failure. In addition, the sucked ink is drained to a waste ink container 508 disposed on a lower portion of the recording apparatus body 91, is absorbed into an ink absorber in the waste ink container 508, and is retained in the ink absorber.

The liquid discharge apparatus 500 according to this embodiment includes the above-described liquid discharge heads 104. Accordingly, the piezoelectric elements of the liquid discharge head 104 secure a sufficient amount of deformation (amount of surface displacement) to preferably maintain ink discharge properties and sufficiently suppress degradation of the amount of deformation (the amount of surface displacement) even after continuous discharge, thus allowing the liquid discharge apparatus 500 to perform stable ink discharge.

The image forming apparatus (the inkjet recording apparatus) as the liquid discharge apparatus 500 according to this embodiment mounts the liquid discharge heads 104 according to any of the above-described Examples 1 to 8.

The liquid discharge heads 104 were produced using the piezoelectric elements prepared in Examples 1 to 8, and the liquid discharge heads 104 were evaluated for the discharging performance of ink using the liquid discharge apparatus 500. Observing a discharged state when a voltage of from −10 V to −30 V was applied by a simple push waveform using ink of which viscosity was adjusted to 5 cp, it was confirmed that ink droplets were discharged from all of the nozzles.

On the other hand, when the liquid discharge heads 104 of Comparative Examples 1 and 2 were evaluated for the same discharging performance as described-above, the voltage necessary for discharging ink from entire nozzles of the liquid discharge heads 104 was higher than that of the liquid discharge heads 104 of Examples 1 to 8. The discharge status of the liquid discharge heads 104 of Comparative Examples 1 and 2 were unstable.

In the present disclosure, the liquid discharge apparatus 500 includes the liquid discharge head 104 or the liquid discharge device 440, and drives the liquid discharge head 104 to discharge liquid. The liquid may be, for example, an apparatus capable of discharging liquid to a material, to which liquid can adhere, and an apparatus to discharge liquid toward gas or into liquid.

The liquid discharge apparatus may include devices to feed, convey, and eject the material on which liquid can adhere. The liquid discharge apparatus 500 may further include a pretreatment apparatus to coat a treatment liquid onto the material, and a post-treatment apparatus to coat a treatment liquid onto the material, onto which the liquid has been discharged.

The liquid discharge apparatus may be, for example, an image forming apparatus to form an image on a sheet by discharging ink, or a three-dimensional apparatus to discharge a molding liquid to a powder layer in which powder material is formed in layers, so as to form a three-dimensional article.

In addition, the liquid discharge apparatus is not limited to such an apparatus to form and visualize meaningful images, such as letters or figures, with discharged liquid. For example, the liquid discharge apparatus may be an apparatus to form meaningless images, such as meaningless patterns, or fabricate three-dimensional images.

The above-described term "material on which liquid can be adhered" represents a material on which liquid is at least temporarily adhered, a material on which liquid is adhered and fixed, or a material into which liquid is adhered to permeate. Examples of the "material on which liquid can be adhered" include recording media, such as paper sheet, recording paper, recording sheet of paper, film, and cloth, electronic component, such as electronic substrate and piezoelectric element, and media, such as powder layer, organ model, and testing cell. The "material on which liquid can be adhered" includes any material on which liquid is adhered, unless particularly limited.

Examples of the material on which liquid can be adhered include any materials on which liquid can be adhered even temporarily, such as paper, thread, fiber, fabric, leather, metal, plastic, glass, wood, ceramic, building materials, such as wall paper or flooring, textile, such as clothing.

In the present disclosure, discharged liquid is not limited to a particular liquid as long as the liquid has a viscosity or surface tension to be discharged from a liquid discharge head. However, preferably, the viscosity of the liquid is not greater than 30 mPa·s under ordinary temperature and ordinary pressure or by heating or cooling.

Examples of the liquid include a solution, a suspension, or an emulsion including, for example, a solvent, such as water or an organic solvent, a colorant, such as dye or pigment, a functional material, such as a polymerizable compound, a resin, a surfactant, a biocompatible material, such as DNA, amino acid, protein, or calcium, and an edible material, such as a natural colorant. Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication. Examples of the liquid are, e.g., ink, treatment liquid, DNA sample, resist, pattern material, binder, mold liquid, or solution and dispersion liquid including amino acid, protein, or calcium.

The liquid discharge apparatus may be an apparatus to relatively move a liquid discharge head and a material on which liquid can be adhered. However, the liquid discharge apparatus is not limited to such an apparatus. For example, the liquid discharge apparatus may be a serial head apparatus that moves the liquid discharge head or a line head apparatus that does not move the liquid discharge head.

Examples of the liquid discharge apparatus further include a treatment liquid coating apparatus to discharge a treatment liquid to a sheet to coat the treatment liquid on the surface of the sheet to reform the sheet surface and an injection granulation apparatus in which a composition liquid including raw materials dispersed in a solution is injected through nozzles to granulate fine particles of the raw materials.

The liquid discharge device 440 is an integrated unit of the liquid discharge head 104 and an external component(s), such as a functional part(s) or mechanism(s), and is an assembly of parts relating to liquid discharge. For example, the liquid discharge device may be a combination of the liquid discharge head (e.g., the liquid discharge head 104) with at least one of a head-tank (e.g., the head-tank 441), a carriage (e.g., the carriage 103), a supply unit, a maintenance unit (e.g., the recovery device 127), and a main-scanning-moving device 493 (e.g., the timing belt 110, the driving pulley 108, the main scanning motor 107, and the driven pulley 109 as illustrated in FIGS. 20 and 23).

Here, examples of the integrated unit include a combination in which the liquid discharge head and a functional part(s) are secured to each other through, e.g., fastening, bonding, or engaging, and a combination in which one of the liquid discharge head 104 and a functional part(s) is movably held by another. The liquid discharge head 104 may be detachably attached to the functional part(s) or unit(s) each other.

Figure 22:
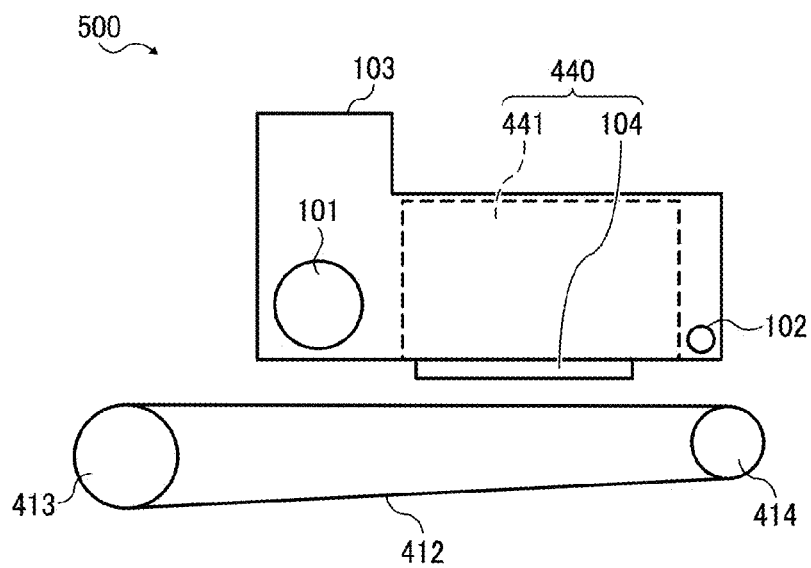
FIG. 22 is a cross-sectional view of a liquid discharge apparatus.
Figure 24:
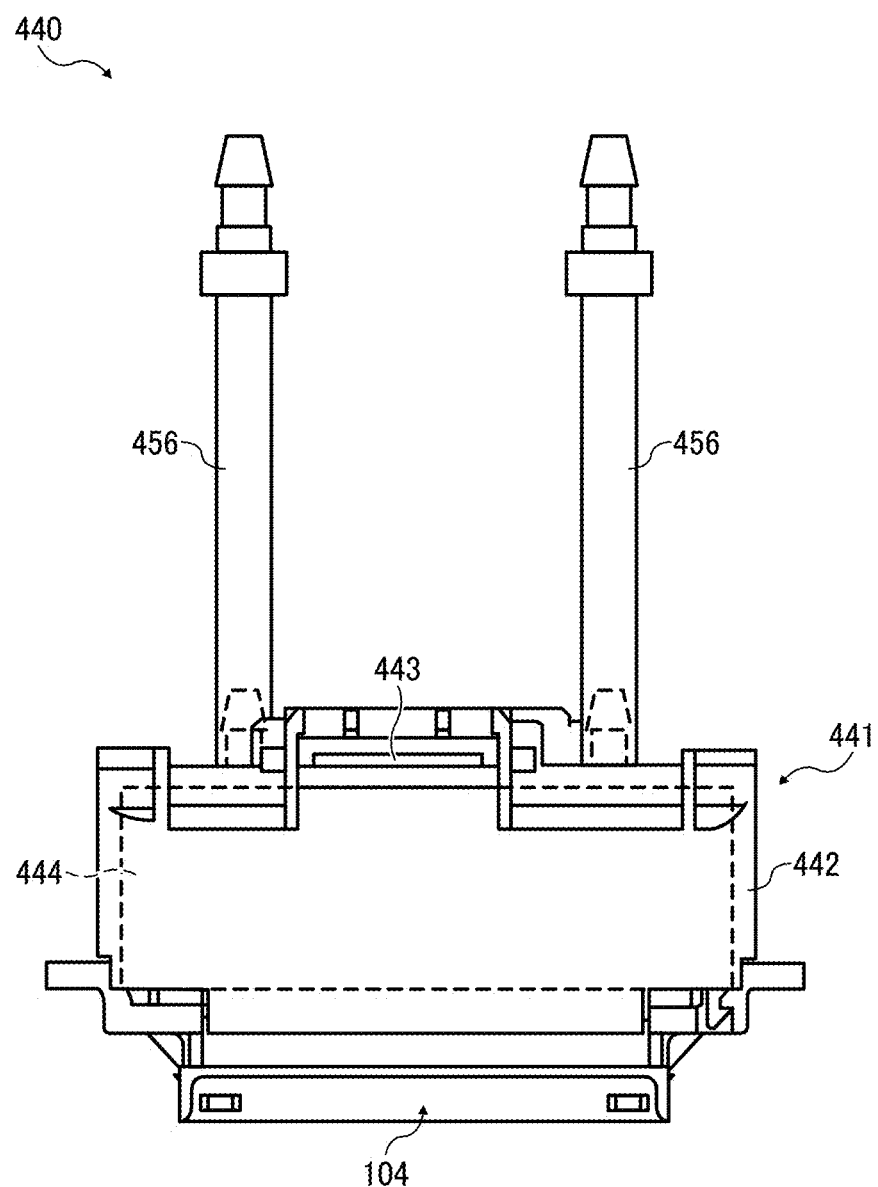
FIG. 24 is a schematic view of a liquid discharge device.

FIG. 22 is a cross-sectional view of a liquid discharge apparatus 500. The liquid discharge head 104 and a head-tank 441 are integrated as the liquid discharge device 440 as illustrated in FIG. 22 and FIG. 24. The liquid discharge head 104 and the head-tank 441 may be connected each other via, e.g., a tube to integrally form the liquid discharge device. A filter may further be added to a portion between the head-tank 441 and the liquid discharge head 104.

The liquid discharge device includes a conveyor belt 412 and rollers 413 and 414 for driving the conveyor belt 412. The conveyor belt 412 and the rollers 413 and 414 act as a conveyor to convey the sheets 93 at a position facing the liquid discharge head 104. The conveyor belt 412 is an endless belt. The conveyor belt 412 is stretched between the rollers 413 and 414. The conveyor belt 412 attracts the sheet 93. The attraction can be achieved by using electrostatic attraction or air suction.

In another example, the liquid discharge device 440 may be an integrated unit in which a liquid discharge head 104 is integrated with a carriage 103.

FIG. 23 is a plan view of a liquid discharge device 440. As illustrated in FIG. 23, the liquid discharge device 440 includes the carriage 103 mounting the liquid discharge head 104 movably held by the main-guide rod 101 and the sub-guide rod 102 that form part of a main-scanning-moving device 493, so that the liquid discharge head 104, the carriage 103, and the main-scanning-moving device 493 are integrated as a single unit. Thus, the liquid discharge device 440 may be an integrated unit in which the liquid discharge head 104, the carriage 103, and the main-scanning-moving device 493 are integrally formed as a single unit.

The liquid discharge device 440 is a serial device. A main-scanning-moving device 493 reciprocally scans the carriage 103 in a main scanning direction D1 as illustrated by arrow in FIG. 23. The main-scanning-moving device 493 includes the main-guide rod 101, the sub-guide rod 102, the main scanning motor 107, and the timing belt 110. The main-guide rod 101 is bridged between left and right side plates 491A and 491B to movably hold the carriage 103. The carriage 103 reciprocally moves in the main scanning direction by the main scanning motor 107 through the timing belt 110 stretched between a driving pulley 108 and a driven pulley 109. The liquid discharge head 104 is installed in the carriage 103 and is integrated with the head-tank 441. The liquid discharge head 104 is installed in the carriage 103 in such a manner that the discharging direction is directed downward as illustrated in FIG. 22.

In another example, the capping device 504 that forms part of the recovery device 127 is secured to the carriage 103 mounting the liquid discharge head 104 so that the liquid discharge head 104, the carriage 103, and the recovery device 127 are integrated as a single unit to form the liquid discharge device 440.

FIG. 24 is a schematic view of an example of the liquid discharge device 440. The liquid discharge device 440 includes the liquid discharge head 104 and the head-tank 441. The head-tank 441 includes a flow channel component 444, a cover 442, a connector 443, and tubes 456.

The tubes 456 are connected to the flow channel component 444. The flow channel component 444 is disposed inside the cover 442. At the upper portion of the flow channel component 444, the connector 443 is provided, which is for establishing electrical coupling with the liquid discharge head 104. The head-tank 441 acts as a supply assembly so that the liquid discharge head 104 is supplied with liquid through the tubes 456 and the flow channel component 444 of the head-tank 441. The head-tank 441 is mounted on the liquid discharge head 104 so that the liquid discharge head 104, head-tank 441, and tubes 456 are integrated as a single unit.

The main-scanning-moving device 493 may be only a guide member such as the main-guide rod 101 and the sub-guide rod 102. The supply unit may be tubes 456 only or a loading unit to load the ink cartridges 105 only.

The above-described term "image forming", "recording", "printing", "photography", and "fabricating" in the present disclosure has same meaning.

The above-described embodiments are limited examples, and the present disclosure includes, for example, the following aspects having advantageous effects.

Aspect A

A liquid discharge head 104 includes a nozzle plate 82, a substrate 21, and a diaphragm 22, and a piezoelectric element 200. The nozzle plate 82 includes a nozzle 81 from which liquid is discharged. The substrate 21 is formed (disposed) on the nozzle plate 82 and including a pressure chamber 80 communicating with the nozzle 81. Specifically, the substrate 21 is bonded with the nozzle plate 82. The diaphragm 22 is formed (disposed) on a first side of the substrate 21 opposite a second side of the substrate 21 on which the nozzle plate 82 is formed (disposed), the diaphragm constituting one wall of the pressure chamber 80. Specifically, the diaphragm 22 is bonded with the substrate 21 on an opposite side of the substrate 21, on which the nozzle plate 82 is bonded. The piezoelectric element 200 is formed (disposed) on the diaphragm 22 to deform the diaphragm 22 to discharge liquid in the pressure chamber 80 from the nozzle 81.

The Piezoelectric element 200 includes a first electrode 23, a piezoelectric film 24, and a second electrode 25. The first electrode 23 is directly on or indirectly formed (disposed) on the diaphragm 22. The piezoelectric film 24 is disposed on the first electrode 23. The second electrode 25 is directly on or indirectly formed (disposed) on the piezoelectric film 24. The piezoelectric film 24 is a $\{100\}$ preferentially oriented polycrystalline film in which $\{100\}$ plane is preferentially oriented.

The pressure chamber 80 has a first length Lx in X-direction and a second length Ly that is longer than the first length Lx in Y-direction perpendicular to the X-direction. A first domain ratio $S1x=Sc/(Sa+Sc)$ is different from a second domain ratio of S1y=Sc/(Sa+Sc), where the first domain ratio S1x=Sc/(Sa+Sc) is measured such that an incident surface of X-ray in the θ-2θ measurement is parallel to the X-direction, and the second domain ratio S1y=Sc/(Sa+Sc) is measured such that an incident surface of X-ray in the θ-2θ measurement is parallel to the Y-direction.

Two diffraction peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film (24) according to the X-ray diffraction method.

As described above in Examples 1 to 8, the liquid discharge head 104 according to Aspect A can obtain the value of piezoelectric constant d31 in the range of from −120 pm/V to −160 pm/V as initial properties and as properties after durability test. Thus, the liquid discharge head 104 can secure a sufficient amount of deformation to preferably maintain ink discharge properties and sufficiently suppress degradation of the amount of deformation even after continuous discharge (the drive voltage having the predetermined pulse waveform was repetitively applied $1\times10^{10}$ times), thus allowing the liquid discharge apparatus 500 to perform stable ink discharge.

Aspect B

In the liquid discharge head 104 according to the above-described Aspect A, the first domain ratio S1x is greater than the second domain ratio S1y.

As described above in Examples 1 to 8, the liquid discharge head 104 according to Aspect B can obtain the value of piezoelectric constant d31 in the range of from −120 pm/V to −160 pm/V as initial properties and as properties after durability test. Thus, the liquid discharge head 104 can secure a sufficient amount of deformation to preferably maintain ink discharge properties and sufficiently suppress degradation of the amount of deformation even after continuous discharge (the drive voltage having the predetermined pulse waveform was repetitively applied $1\times10^{10}$ times), thus allowing the liquid discharge apparatus 500 to perform stable ink discharge.

Aspect C

In the liquid discharge head 104 according to the above-described Aspect A or B, the liquid discharge head 104 includes a nozzle plate 82, a substrate 21, a diaphragm 22, and a piezoelectric element 200. The nozzle plate 82 includes a nozzle 81 from which liquid is discharged. The substrate 21 is formed (disposed) on the nozzle plate 82 and including a pressure chamber 80 connected to the nozzle 81. The diaphragm 22 is formed (disposed) on a first side of the substrate 21 opposite a second side of the substrate 21 on which the nozzle plate 82 is formed (disposed), the diaphragm constituting one wall of the pressure chamber 80. The piezoelectric element 200 formed (disposed) on the diaphragm 22 to deform the diaphragm 22 to discharge liquid in the pressure chamber 80 from the nozzle 81.

The piezoelectric element 200 includes a first electrode 23, a piezoelectric film 24, and a second electrode 25. The first electrode 23 is directly on or indirectly formed (disposed) on the diaphragm 22. The piezoelectric film 24 is disposed on the first electrode 23. The second electrode 25 is directly on or indirectly formed (disposed) on the piezoelectric film 24. The piezoelectric film 24 is a {100} preferentially oriented polycrystalline film in which {100} plane is preferentially oriented.

The pressure chamber 80 has a first length Lx in X-direction and second length Ly in Y-direction perpendicular to the X-direction. The second length Ly being longer than the first length Lx.

A first domain ratio S2x=Sc/(Sa+Sc+Sb) is different from a second domain ratio S2y=Sc/(Sa+Sc+Sb). The first domain ratio S2x=Sc/(Sa+Sc+Sb) is measured such that an incident surface of X-ray in the θ-2θ measurement is parallel to the X-direction, and the second domain ratio S2y=Sc/(Sa+Sc+Sb) is measured such that an incident surface of X-ray in the θ-2θ measurement is parallel to the Y-direction.

Two of diffraction-peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film 24 according to the X-ray diffraction method, and a diffraction-peak area Sb attributes to any one of a rhombohedral structure, an orthorhombic structure, and a pseudo-cubic structure.

As described above in Examples 1 to 8, the liquid discharge head 104 according to Aspect C can obtain the value of piezoelectric constant d31 in the range of from −120 pmN to −160 pm/V as initial properties and as properties after durability test. Thus, the liquid discharge head 104 can secure a sufficient amount of deformation to preferably maintain ink discharge properties and sufficiently suppress degradation of the amount of deformation even after continuous discharge (the drive voltage having the predetermined pulse waveform was repetitively applied $1\times10^{10}$ times), thus allowing the liquid discharge apparatus 500 to perform stable ink discharge.

Aspect D

In the liquid discharge head 104 according to the above-described Aspect C, the first domain ratio S2x is greater than the second domain ratio S2y.

As described above in Examples 1 to 8, the liquid discharge head 104 according to Aspect D can obtain the value of piezoelectric constant d31 in the range of from −120 pm/V to −160 pm/V as initial properties and as properties after durability test. Thus, the liquid discharge head 104 can secure a sufficient amount of deformation to preferably maintain ink discharge properties and sufficiently suppress degradation of the amount of deformation even after continuous discharge (the drive voltage having the predetermined pulse waveform was repetitively applied $1\times10^{10}$ times), thus allowing the liquid discharge apparatus 500 to perform stable ink discharge.

Aspect E

In the liquid discharge head 104 according to the above-described Aspect A, the piezoelectric film 24 is made of lead zirconate titanate (PZT), and a value of Ti/(Zr+Ti) is not less than 45% and not greater than 55%, where Ti/(Zr+Ti) represents a composition ratio of Zr and Ti in the piezoelectric film 24.

As described above in Examples 1 to 8, the liquid discharge head 104 according to Aspect E can sufficiently suppress degradation of the amount of deformation even after continuous discharge (the drive voltage having the predetermined pulse waveform was repetitively applied $1\times10^{10}$ times), thus allowing the liquid discharge apparatus 500 to perform stable ink discharge.

Aspect F

In the liquid discharge head 104 according to the above-described Aspect A, a diffraction peak position of an X-ray derived from the {200} plane of the piezoelectric film 24 is in a range of 44.50°≤2θ≤44.80° in a state in which the piezoelectric film 24 is formed (disposed) on the diaphragm, and a diffraction peak shape derived from the {200} plane or the {400} plane is asymmetric.

The liquid discharge head 104 according to Aspect F can obtain sufficient deformation (surface displacement) of the piezoelectric film 24 by (1) an increase of displacement due to piezoelectric strain and (2) an increase of strain due to domain rotation when voltage is applied.

Aspect G

In the liquid discharge head 104 according to the above-described Aspect A, the first length Lx of the pressure chamber is not less than 50 µm and is not greater than 70 µm. A ratio Ly/Lx of the pressure chamber is not less than 10, where Lx represents the first length Lx and Ly represents the second length of the pressure chamber.

As described above in Examples 1 to 8, the liquid discharge head 104 according to Aspect G can sufficiently suppress degradation of the amount of deformation even after continuous discharge (the drive voltage having the predetermined pulse waveform was repetitively applied $1 \times 10^{10}$ times), thus allowing the liquid discharge apparatus 500 to perform stable ink discharge.

Aspect H

In the liquid discharge head 104 according to the above-described Aspect A, the liquid discharge head 104 includes a seed layer made of lead titanate (PT) between the piezoelectric film 24 and the first electrode 23.

As described above in Examples 1 to 8, the liquid discharge head 104 according to Aspect H can sufficiently suppress degradation of the amount of deformation even after continuous discharge (the drive voltage having the predetermined pulse waveform was repetitively applied $1 \times 10^{10}$ times), thus allowing the liquid discharge apparatus 500 to pedal n stable ink discharge.

Aspect I

In the liquid discharge head 104 according to the above-described Aspect A, the diaphragm includes a plurality of layers, and the diaphragm is a compressed film having a compressive inner stress.

The liquid discharge head 104 according to Aspect I can increase the discharge property of the piezoelectric element 200.

Aspect J

In the liquid discharge head 104 according to the above-described Aspect A, the compressed film includes a $SiO_2$ layer and a Si layer as the plurality of layers.

As described above in Examples 5 to 8, the liquid discharge head 104 according to Aspect J can increase the piezoelectric constant d31 compare to Examples 1 to 4.

Aspect K

In the liquid discharge head 104 according to the above-described Aspect J, the compressed film includes a plurality of $SiO_2$ layers and a plurality of Si layers alternately laminated as the plurality of layers.

As described above in Examples 5 to 8, the liquid discharge head 104 according to Aspect K can increase the piezoelectric constant d31 compare to Examples 1 to 4.

Aspect L

A liquid discharge device 440 includes a liquid discharge head 104 and a head-tank 441. The liquid discharge head 104 discharges liquid. The head-tank 441 supplies liquid to the liquid discharge head 104. The liquid discharge head 104 includes a nozzle plate 82, a substrate 21, a diaphragm 22, and a piezoelectric element. The nozzle plate 82 includes a nozzle 81 from which liquid is discharged. The substrate 21 is formed (disposed) on the nozzle plate 82 and including a pressure chamber 80 communicating with the nozzle 81. The diaphragm 22 is formed (disposed) on a first side of the substrate 21 opposite a second side of the substrate 21 on which the nozzle plate 82 is formed (disposed), the diaphragm constituting one wall of the pressure chamber 80. The piezoelectric element 200 is formed (disposed) on the diaphragm 22 to deform the diaphragm 22 to discharge liquid in the pressure chamber 80 from the nozzle 81.

The piezoelectric element 200 includes a first electrode 23, a piezoelectric film 24, and a second electrode 25. The first electrode 23 is directly on or indirectly formed (disposed) on the diaphragm 22. The piezoelectric film 24 is disposed on the first electrode 23. The second electrode 25 is directly on or indirectly formed (disposed) on the piezoelectric film 24.

The piezoelectric film 24 is a {100} preferentially oriented polycrystalline film in which {100} plane is preferentially oriented. The pressure chamber has a first length Lx in X-direction and a second length Ly that is longer than the first length Lx in Y-direction perpendicular to the X-direction. A first domain ratio S1x=Sc/(Sa+Sc) is different from a second domain ratio of S1y=Sc/(Sa+Sc). The first domain ratio S1x=Sc/(Sa+Sc) is measured such that an incident surface of X-ray in the θ-2θ measurement is parallel to the X-direction, and the second domain ratio S1y=Sc/(Sa+Sc) is measured such that an incident surface of X-ray in the θ-2θ measurement is parallel to the Y-direction.

Two diffraction peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film 24 according to the X-ray diffraction method.

As described above in Examples 1 to 8, the liquid discharge head 104 according to Aspect L can obtain the value of piezoelectric constant d31 in the range of from −120 pmN to −160 pm/V as initial properties and as properties after durability test. Thus, the liquid discharge head 104 can secure a sufficient amount of deformation to preferably maintain ink discharge properties and sufficiently suppress degradation of the amount of deformation even after continuous discharge (the drive voltage having the predetermined pulse waveform was repetitively applied $1 \times 10^{10}$ times), thus allowing the liquid discharge apparatus 500 to perform stable ink discharge.

Aspect M

A liquid discharge apparatus 500 includes a liquid discharge head 104 and a conveyor. The liquid discharge head 104 discharge liquid. The conveyor conveys medium to the liquid discharge head 104. The liquid discharge head includes a nozzle plate 82, a substrate 21, a diaphragm 22, and a piezoelectric element 200. The nozzle plate 82 includes a nozzle 81 from which liquid is discharged. The substrate 21 is formed (disposed) on the nozzle plate 82. The substrate 21 includes a pressure chamber 80 communicating with the nozzle 81. The diaphragm 22 is formed (disposed) on a first side of the substrate 21 opposite a second side of the substrate 21 on which the nozzle plate 82 is formed (disposed), the diaphragm constituting one wall of the pressure chamber 80. The piezoelectric element 200 is formed (disposed) on the diaphragm 22 to deform the diaphragm 22 to discharge liquid in the pressure chamber 80 from the nozzle 81.

The piezoelectric element 200 includes a first electrode 23, a piezoelectric film, and a second electrode 25. The first electrode 23 is directly on or indirectly formed (disposed) on the diaphragm 22. The piezoelectric film 24 is disposed on the first electrode 23. The second electrode 25 is directly on or indirectly formed (disposed) on the piezoelectric film 24.

The piezoelectric film 24 is a {100} preferentially oriented polycrystalline film in which {100} plane is preferentially oriented. The pressure chamber has a first length Lx in X-direction and a second length Ly that is longer than the first length Lx in Y-direction perpendicular to the X-direction. A first domain ratio S1x=Sc/(Sa+Sc) is different from a second domain ratio of S1y=Sc/(Sa+Sc). The first domain ratio S1x=Sc/(Sa+Sc) is measured such that an incident surface of X-ray in the θ-2θ measurement is parallel to the X-direction, and the second domain ratio S1y=Sc/(Sa+Sc) is measured such that an incident surface of X-ray in the θ-2θ measurement is parallel to the Y-direction.

Two diffraction peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film (24) according to the X-ray diffraction method.

As described above in Examples 1 to 8, the liquid discharge head 104 according to Aspect M can obtain the value of piezoelectric constant d31 in the range of from −120 pm/V to −160 pm/V as initial properties and as properties after durability test. Thus, the liquid discharge head 104 can secure a sufficient amount of deformation to preferably maintain ink discharge properties and sufficiently suppress degradation of the amount of deformation even after continuous discharge (the drive voltage having the predetermined pulse waveform was repetitively applied $1\times10^{10}$ times), thus allowing the liquid discharge apparatus 500 to perform stable ink discharge.

As described in the above-described embodiments, the liquid discharge head 104 including the piezoelectric element 200 of the present embodiment can secure a sufficient amount of deformation (amount of surface displacement) to preferably maintain ink discharge properties and sufficiently suppress degradation of the amount of deformation (the amount of surface displacement) even after continuous discharge, thus allowing the liquid discharge apparatus 500 to perform stable ink discharge.

In the above-described embodiments of the present disclosure, the liquid discharge apparatus 500 includes a liquid discharge device 440 that drives the liquid discharge head 104 to discharge liquid. The liquid discharge apparatus 500 may be, for example, an apparatus capable of discharging liquid onto a material, to which liquid can adhere, or an apparatus to discharge liquid toward gas or into another liquid. The liquid discharge apparatus 500 includes a three-dimensional fabricating apparatus, a liquid coating apparatus, and a toner manufacturing apparatus, etc.

Numerous additional modifications and variations are possible in light of the above teachings. It is therefore to be understood that, within the scope of the above teachings, the present disclosure may be practiced otherwise than as specifically described herein. With some embodiments having thus been described, it is obvious that the same may be varied in many ways. Such variations are not to be regarded as a departure from the scope of the present disclosure and appended claims, and all such modifications are intended to be included within the scope of the present disclosure and appended claims.

What is claimed is:

1. A liquid discharge head comprising:
   a nozzle plate including a nozzle from which liquid is discharged;
   a substrate disposed on the nozzle plate and including a pressure chamber communicating with the nozzle;
   a diaphragm disposed on a first side of the substrate opposite a second side of the substrate on which the nozzle plate is disposed, the diaphragm constituting one wall of the pressure chamber; and
   a piezoelectric element disposed on the diaphragm to deform the diaphragm to discharge liquid in the pressure chamber from the nozzle,
   wherein the piezoelectric element includes a first electrode disposed on the diaphragm, piezoelectric film disposed on the first electrode, and a second electrode disposed on the piezoelectric film,
   wherein the piezoelectric film is {100} plane preferentially oriented polycrystalline film in which the {100} plane is preferentially oriented,
   wherein the pressure chamber has a first length Lx in X-direction and a second length Ly in Y-direction perpendicular to the X-direction, the second length Ly being longer than the first length Lx,
   wherein a first domain ratio S1x=Sc/(Sa+Sc) is different from a second domain ratio of S1y=Sc/(Sa+Sc),
   where the first domain ratio S1x=Sc/(Sa+Sc) is measured such that an incident surface of X-ray in θ-2θ measurement is parallel to the X-direction, and the second domain ratio S1y=Sc/(Sa+Sc) is measured such that an incident surface of X-ray in the θ-2θ measurement is parallel to the Y-direction, and
   where two diffraction peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film by X-ray diffraction.

2. The liquid discharge head according to claim 1, wherein the first domain ratio S1x is greater than the second domain ratio S1y.

3. The liquid discharge head according to claim 1, wherein the piezoelectric film is made of lead zirconate titanate (PZT),
   wherein a value of Ti/(Zr+Ti) is not less than 45% and not greater than 55%, and
   where Ti/(Zr+Ti) represents a composition ratio of Zr and Ti in the piezoelectric film (24).

4. The liquid discharge head according to claim 1, wherein a diffraction peak position of an X-ray derived from the {200} plane of the piezoelectric film is in a range of 44.50°≤2θ≤44.80° in a state in which the piezoelectric film is disposed on the diaphragm, and
   wherein a diffraction peak shape derived from the {200} plane or the {400} plane is asymmetric.

5. The liquid discharge head according to claim 1, wherein the first length Lx of the pressure chamber is not less than 50 μm and is not greater than 70 μm, and
   wherein a ratio Ly/Lx of the pressure chamber is not less than 10,
   where Lx represents the first length Lx and Ly represents the second length of the pressure chamber.

6. The liquid discharge head according to claim 1, further comprising a seed layer made of lead titanate (PT) between the piezoelectric film and the first electrode.

7. The liquid discharge head according to claim 1, wherein the diaphragm is a compressed film including a plurality of layers and having compressive inner stress.

8. The liquid discharge head according to claim 7, wherein the diaphragm includes a $SiO_2$ layer and a Si layer as the plurality of layers.

9. The liquid discharge head according to claim 8, wherein the diaphragm includes a plurality of $SiO_2$ layers and a plurality of Si layers alternately laminated as the plurality of layers.

10. A liquid discharge head comprising:
a nozzle plate including a nozzle from which liquid is discharged;
a substrate disposed on the nozzle plate and including a pressure chamber communicating with the nozzle;
a diaphragm disposed on a first side of the substrate opposite a second side of the substrate on which the nozzle plate is disposed, the diaphragm constituting one wall of the pressure chamber; and
a piezoelectric element disposed on the diaphragm to deform the diaphragm to discharge liquid in the pressure chamber from the nozzle,
wherein the piezoelectric element includes a first electrode disposed on the diaphragm, a piezoelectric film disposed on the first electrode, and a second electrode disposed on the piezoelectric film,
wherein the piezoelectric film is a {100} preferentially oriented polycrystalline film in which {100} plane is preferentially oriented,
wherein the pressure chamber has a first length Lx in X-direction and a second length Ly in Y-direction perpendicular to the X-direction, the second length Ly being longer than the first length Lx,
wherein a first domain ratio S2x=Sc/(Sa+Sc+Sb) is different from a second domain ratio S2 y=Sc/(Sa+Sc+Sb),
where the first domain ratio S2x=Sc/(Sa+Sc+Sb) is measured such that an incident surface of X-ray in θ-2θ measurement is parallel to the X-direction, and the second domain ratio S2y=Sc/(Sa+Sc+Sb) is measured such that an incident surface of X-ray in the θ-2θ measurement is parallel to the Y-direction, and
where two of diffraction-peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film by X-ray diffraction, and a diffraction-peak area Sb attributes to any one of a rhombohedral structure, an orthorhombic structure, and a pseudo-cubic structure.

11. The liquid discharge head according to claim 10, wherein the first domain ratio S2x is greater than the second domain ratio S2y.

12. A liquid discharge device comprising:
a liquid discharge head to discharge liquid; and
a head-tank to supply liquid to the liquid discharge head,
wherein the liquid discharge head comprises:
a nozzle plate including a nozzle from which liquid is discharged;
a substrate disposed on the nozzle plate and including a pressure chamber communicating with the nozzle;
a diaphragm disposed on a first side of the substrate opposite a second side of the substrate on which the nozzle plate is disposed, the diaphragm constituting one wall of the pressure chamber, and
a piezoelectric element disposed on the diaphragm to deform the diaphragm to discharge liquid in the pressure chamber from the nozzle,
wherein the piezoelectric element includes a first electrode disposed on the diaphragm, a piezoelectric film disposed on the first electrode, and a second electrode disposed on the piezoelectric film,
wherein the piezoelectric film is a {100} preferentially oriented polycrystalline film in which {100} plane is preferentially oriented,
wherein the pressure chamber has a first length Lx in X-direction and a second length Ly in Y-direction perpendicular to the X-direction, the second length Ly being longer than the first length Lx,
wherein a first domain ratio S1x=Sc/(Sa+Sc) is different from a second domain ratio of S1y=Sc/(Sa+Sc),
where the first domain ratio S1x=Sc/(Sa+Sc) is measured such that an incident surface of X-ray in θ-2θ measurement is parallel to the X-direction, and the second domain ratio S1y=Sc/(Sa+Sc) is measured such that an incident surface of X-ray in the θ-2θ measurement is parallel to the Y-direction, and
where two diffraction peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film by X-ray diffraction.

13. A liquid discharge apparatus comprising:
a liquid discharge head to discharge liquid;
a conveyor to convey medium to the liquid discharge head,
wherein the liquid discharge head comprises:
a nozzle plate including a nozzle from which liquid is discharged;
a substrate disposed on the nozzle plate and including a pressure chamber communicating with the nozzle;
a diaphragm disposed on a first side of the substrate opposite a second side of the substrate on which the nozzle plate is disposed, the diaphragm constituting one wall of the pressure chamber; and
a piezoelectric element disposed on the diaphragm to deform the diaphragm to discharge liquid in the pressure chamber from the nozzle,
wherein the piezoelectric element includes a first electrode disposed on the diaphragm, a piezoelectric film disposed on the first electrode, and a second electrode disposed on the piezoelectric film,
wherein the piezoelectric film is a {100} preferentially oriented polycrystalline film in which {100} plane is preferentially oriented,
wherein the pressure chamber has a first length Lx in X-direction and a second length Ly in Y-direction perpendicular to the X-direction, the second length Ly being longer than the first length Lx,
wherein a first domain ratio S1x=Sc/(Sa+Sc) is different from a second domain ratio of S1y=Sc/(Sa+Sc),
where the first domain ratio S1x=Sc/(Sa+Sc) is measured such that an incident surface of X-ray in θ-2θ measurement is parallel to the X-direction, and the second domain ratio S1y=Sc/(Sa+Sc) is measured such that an incident surface of X-ray in the θ-2θ measurement is parallel to the Y-direction, and
where two diffraction peak areas Sa and Sc are attributed to a tetragonal a-domain structure and a tetragonal c-domain structure, respectively, among a plurality of diffraction peak areas obtained by a peak separation process of diffraction peaks derived from {200} plane or {400} plane obtained by the θ-2θ measurement of the piezoelectric film by X-ray diffraction.

* * * * *